(12) United States Patent
Takobe

(10) Patent No.: US 11,728,719 B2
(45) Date of Patent: Aug. 15, 2023

(54) LINEAR POWER SUPPLY CIRCUIT AND SOURCE FOLLOWER CIRCUIT

(71) Applicant: Rohm Co., Ltd., Kyoto (JP)

(72) Inventor: Isao Takobe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 78 days.

(21) Appl. No.: 17/439,512

(22) PCT Filed: Apr. 10, 2020

(86) PCT No.: PCT/JP2020/016153
§ 371 (c)(1),
(2) Date: Sep. 15, 2021

(87) PCT Pub. No.: WO2020/209369
PCT Pub. Date: Oct. 15, 2020

(65) Prior Publication Data
US 2022/0158535 A1  May 19, 2022

(30) Foreign Application Priority Data

Apr. 12, 2019 (JP) .................................. 2019-076455
Apr. 26, 2019 (JP) .................................. 2019-086504
Mar. 24, 2020 (JP) .................................. 2020-053149

(51) Int. Cl.
*H02M 1/00* (2006.01)
*B60L 1/00* (2006.01)
(Continued)

(52) U.S. Cl.
CPC ............. *H02M 1/0045* (2021.05); *B60L 1/00* (2013.01); *H02M 1/088* (2013.01); *H02M 3/07* (2013.01)

(58) Field of Classification Search
CPC ....... H02M 1/0045; H02M 1/088; H02M 3/07
See application file for complete search history.

(56) References Cited

U.S. PATENT DOCUMENTS 6,369,554 B1    4/2002  Aram
10,768,650 B1 *  9/2020  Huang .................... G05F 1/575
(Continued)

FOREIGN PATENT DOCUMENTS

JP    2003084843    3/2003
JP    2006318204    11/2006
(Continued)

OTHER PUBLICATIONS

International Search Report in International Appln. No. PCT/JP2020/016153, dated Jun. 16, 2020, 5 pages (with English Translation).

*Primary Examiner* — Sibin Chen
(74) *Attorney, Agent, or Firm* — Fish & Richardson P.C.

(57) ABSTRACT

A linear power supply circuit includes an output transistor provided between an input terminal to which an input voltage is applied and an output terminal to which an output voltage is applied, and a driver configured to drive the output transistor based on the difference between a voltage based on the output voltage and a reference voltage. The driver includes a differential amplifier, a converter, and a first capacitor provided between the output of the differential amplifier and a ground potential. The linear power supply circuit further includes a source follower circuit including a first transistor, and moreover includes a second transistor connected in series with the output transistor and constituting together with the first transistor a current mirror circuit, and a second capacitor connected to the control terminal of the first transistor.

10 Claims, 18 Drawing Sheets

(51) Int. Cl.
*H02M 1/088* (2006.01)
*H02M 3/07* (2006.01)

(56) References Cited

U.S. PATENT DOCUMENTS

| | | |
|---|---|---|
| 2011/0025280 A1* | 2/2011 | Kimura ............... H03F 3/45475 |
| | | 330/252 |
| 2011/0089916 A1 | 4/2011 | Soenen et al. |
| 2015/0061621 A1* | 3/2015 | Pons ........................ G05F 1/56 |
| | | 323/280 |
| 2017/0308108 A1 | 10/2017 | Pigott et al. |
| 2019/0258282 A1* | 8/2019 | Magod Ramakrishna ................. |
| | | G05F 1/575 |
| 2020/0133324 A1 | 4/2020 | Nagata et al. |
| 2020/0201373 A1* | 6/2020 | Koay ........................ G05F 1/59 |
| 2021/0116952 A1 | 4/2021 | Nagata et al. |

FOREIGN PATENT DOCUMENTS

| | | |
|---|---|---|
| JP | 2008258849 | 10/2008 |
| JP | 2011090676 | 5/2011 |
| JP | 2018073251 | 5/2018 |
| JP | 2019045886 | 3/2019 |
| JP | 2020071681 | 5/2020 |

\* cited by examiner

LINEAR POWER SUPPLY CIRCUIT AND SOURCE FOLLOWER CIRCUIT

CROSS-REFERENCE TO RELATED APPLICATIONS

This application is a U.S. National Phase application under 35 U.S.C. § 371 of International Patent Application No. PCT/JP2020/016153, filed on Apr. 10, 2020, which claims the priority of Japanese Patent Application Nos. 2019-076455, filed on Apr. 12, 2019; 2019-086504, filed Apr. 26, 2019; and 2020-053149, filed Mar. 24, 2020, the disclosures of which are incorporated herein by reference in their entirety.

TECHNICAL FIELD

The invention disclosed herein relates to linear power supply circuits and source follower circuits.

BACKGROUND

Linear power supply circuits such as those of a LDO (low dropout) type are used as power supplies in various devices.

One example of known technology related to what is mentioned just above is seen in, for example, Patent Document 1 identified below.

A source follower circuit is used, for example, as an impedance conversion circuit.

One example of known technology related to what is mentioned just above is seen in, for example, Patent Document 2 identified below.

CITATION LIST

Patent Literature

Patent Document 1: Japanese unexamined patent application publication No. 2003-84843
Patent Document 2: Japanese unexamined patent application publication No. 2008-258849

SUMMARY

Technical Problem

It is preferable that a linear power supply circuit be capable of fast response so that it can keep the variation of the output voltage small even in the event of an abrupt change in the load. It is also preferable that a linear power supply circuit be capable of achieving stability of the output voltage even in a case where no output capacitor or an output capacitor with a low capacitance is provided.

A source follower circuit that includes an NMOS transistor exhibits, when the input voltage drops, a large drop in the source voltage of the NMOS transistor (i.e., a large difference between the input voltage and the source voltage of the NMOS transistor).

Solution to Problem

According to a first aspect of what is disclosed herein, a linear power supply circuit includes: an output transistor provided between an input terminal to which an input voltage is applied and an output terminal to which an output voltage is applied; and a driver configured to drive the output transistor based on the difference between a voltage based on the output voltage and a reference voltage. The driver includes: a differential amplifier configured to output a voltage commensurate with the difference between the voltage based on the output voltage and the reference voltage; a first capacitor of which one terminal is fed with the output of the differential amplifier and of which the other terminal is fed with a ground potential; a converter configured to convert a voltage based on the output of the differential amplifier into a current and output the current; and a current amplifier configured to current-amplify the output of the converter. The supply voltage for the differential amplifier and for the converter is a voltage that depends on the output voltage. The linear power supply circuit further includes: a source follower circuit or emitter follower circuit including a first transistor of which the first terminal is connected to the input terminal and of which the second terminal is connected to the output terminal; a second transistor connected in series with the output transistor and constituting together with the first transistor a current mirror circuit; and a second capacitor connected to the current amplifier or to the control terminal of the first transistor. (A first configuration.)

According to a first aspect of what is disclosed herein, a linear power supply circuit includes: an output transistor provided between an input terminal to which an input voltage is applied and an output terminal to which an output voltage is applied; and a driver configured to drive the output transistor based on the difference between a voltage based on the output voltage and a reference voltage. The driver includes: a differential amplifier configured to output a voltage commensurate with the difference between the voltage based on the output voltage and the reference voltage; a first capacitor of which one terminal is fed with the output of the differential amplifier and of which the other terminal is fed with the voltage based on the output voltage; a converter configured to convert a voltage based on the output of the differential amplifier into a current and output the current; and a current amplifier configured to current-amplify the output of the converter. Either the supply voltage for the differential amplifier is a first constant voltage and the supply voltage for the current amplifier is a second constant voltage or the supply voltage for the differential amplifier and for the current amplifier is the input voltage. The linear power supply circuit further includes: a source follower circuit or emitter follower circuit including a first transistor of which the first terminal is connected to the input terminal and of which the second terminal is connected to the output terminal; a second transistor connected in series with the output transistor and constituting together with the first transistor a current mirror circuit; and a second capacitor connected to the current amplifier or to the control terminal of the first transistor. (A second configuration.)

In the linear power supply circuit of the first or second configuration described above, the second capacitor may be connected to the control terminal of the first transistor. (A third configuration.)

In the linear power supply circuit of the third configuration described above, the linear power supply circuit may include the source follower circuit. The linear power supply circuit may further include a charge pump circuit provided between the first and second transistors. The charge pump circuit may include the second capacitor, and may be configured to charge the second capacitor with a voltage higher than the input voltage and to feed the charge voltage of the second capacitor to the control terminal of the first transistor. (A fourth configuration.)

In the linear power supply circuit of the fourth configuration described above, the charge pump circuit may be configured to operate based on a clock signal with a clock frequency depending on the source current passing from the output terminal to a load. (A fifth configuration.)

In the linear power supply circuit of the fourth configuration described above, the charge pump circuit may be configured to operate based on a clock signal with a clock frequency depending on the scalar sum of the source current passing from the output terminal to a load and the sink current passing from the load to the output terminal. (A sixth configuration.)

In the linear power supply circuit of any of the fourth to sixth configurations described above, the linear power supply circuit may be configured to be switchable between a first mode in which the charge pump circuit operates and a second mode in which the charge pump circuit does not operate and in which the control terminal of the first transistor and the control terminal of the second transistor are at equal potentials. (A seventh configuration.)

According to a third aspect of what is disclosed herein, a linear power supply circuit includes: an output transistor provided between an input terminal to which an input voltage is applied and an output terminal to which an output voltage is applied; and a driver configured to drive the output transistor based on the difference between a voltage based on the output voltage and a reference voltage. The driver includes: a differential amplifier configured to output a voltage commensurate with the difference between the voltage based on the output voltage and the reference voltage; a first capacitor of which one terminal is fed with the output of the differential amplifier and of which the other terminal is fed with a ground potential; a converter configured to convert a voltage based on the output of the differential amplifier into a current and output the current; and a current amplifier configured to current-amplify the output of the converter. The supply voltage for the differential amplifier and for the converter is a voltage that depends on the output voltage. The output transistor is a PMOSFET. The linear power supply circuit further includes: a second capacitor provided between the gate and the drain of the output transistor. (An eighth configuration.)

According to a fourth aspect of what is disclosed herein, a linear power supply circuit includes: an output transistor provided between an input terminal to which an input voltage is applied and an output terminal to which an output voltage is applied; and a driver configured to drive the output transistor based on the difference between a voltage based on the output voltage and a reference voltage. The driver includes: a differential amplifier configured to output a voltage commensurate with the difference between the voltage based on the output voltage and the reference voltage; a first capacitor of which one terminal is fed with an output of the differential amplifier and of which the other terminal is fed with the voltage based on the output voltage; a converter configured to convert a voltage based on the output of the differential amplifier into a current and output the current; and a current amplifier configured to current-amplify the output of the converter. Either the supply voltage for the differential amplifier is a first constant voltage and the supply voltage for the current amplifier is a second constant voltage or the supply voltage for the differential amplifier and for the current amplifier is the input voltage. The output transistor is a PMOSFET. The linear power supply circuit further includes: a second capacitor provided between the gate and the drain of the output transistor. (A ninth configuration.)

The linear power supply circuit of the eighth or ninth configuration described above may further include: a rectifier provided between the gate and the drain of the output transistor. The rectifier may be configured to stop a current that tends to pass from the gate toward the drain of the output transistor and to pass a current that tends to pass from the drain toward the gate of the output transistor. (A tenth configuration.)

In the linear power supply circuit of the tenth configuration described above, the rectifier may be a buffer amplifier. (An eleventh configuration.)

In the linear power supply circuit of any of the first to eleventh configurations described above, no capacitor may be connected to the output terminal. (A twelfth configuration.)

In the linear power supply circuit of any of the first to eleventh configurations described above, a capacitor with a capacitance less than 100 nF may be connected to the output terminal. (A thirteenth configuration.)

According to another aspect of what is disclosed herein, a semiconductor integrated circuit device includes: a plurality of external pins; and the linear power supply circuit of any of the first to thirteenth configurations described above as an internal power supply The input terminal is connected to one or more of the plurality of the external pins, and the output terminal is connected to none of the plurality of external pins. (A fourteenth configuration.)

According to another aspect of what is disclosed herein, a source follower circuit includes: an input terminal to which an input voltage is applied; an output terminal; a charge pump circuit configured to be fed with the input voltage or a voltage lower than the input voltage; and an NMOSFET having its drain connected to the input terminal and its source connected to the output terminal, with its gate fed with the output voltage of the charge pump circuit. (A fifteenth configuration.)

In the source follower circuit of the fifteenth configuration described above, the charge pump circuit may be configured to operate when the output voltage of the source follower circuit applied to the output terminal is lower than a predetermined value and not to operate when the output voltage of the source follower circuit applied to the output terminal is higher than the predetermined value. (A sixteenth configuration.)

In the source follower circuit of the sixteenth configuration described above, the charge pump circuit may be configured to operate based on a clock signal output from a clock signal generation circuit. The clock signal generation circuit may be configured to output the clock signal when the output voltage of the source follower circuit applied to the output terminal is lower than the predetermined value and not to output the clock signal when the output voltage of the source follower circuit applied to the output terminal is higher than the predetermined value. (A seventeenth configuration.)

In the source follower circuit of the fifteenth configuration described above, the charge pump circuit may be configured to operate based on a clock signal with a clock frequency depending on the source current passing from the output terminal to a load. (An eighteenth configuration.)

In the source follower circuit of the fifteenth configuration described above, the charge pump circuit may be configured to operate based on a clock signal with a clock frequency depending on the scalar sum of the source current passing from the output terminal to a load and the sink current passing from the load to the output terminal. (A nineteenth configuration.)

According to another aspect of what is disclosed herein, a power supply circuit includes: the source follower circuit of any of the fifteenth to nineteenth configurations described above. (A twelfth configuration.)

According to another aspect of what is disclosed herein, a vehicle includes: the linear power supply circuit of one of the first to ninth configurations described above, or the semiconductor integrated circuit device of the tenth configuration described above, or the power supply circuit of the twelfth configuration described above. (A twenty-first embodiment).

Advantageous Effects of Invention

According to one aspect of the invention disclosed herein, it is possible to provide a linear power supply circuit that is capable of fast response and that is capable of achieving stability of the output voltage even in cases where no output capacitor or an output capacitor with a low capacitance is provided.

According to another aspect of the invention disclosed herein, it is possible to provide a source follower circuit that can reduce the drop in the source voltage of an NMOS transistor (the difference between the input voltage and the source voltage of the NMOS transistor) in the event of a drop in the input voltage.

DESCRIPTION OF EMBODIMENTS

1. Linear Power Supply Circuit with Fast Response

Figure 1:
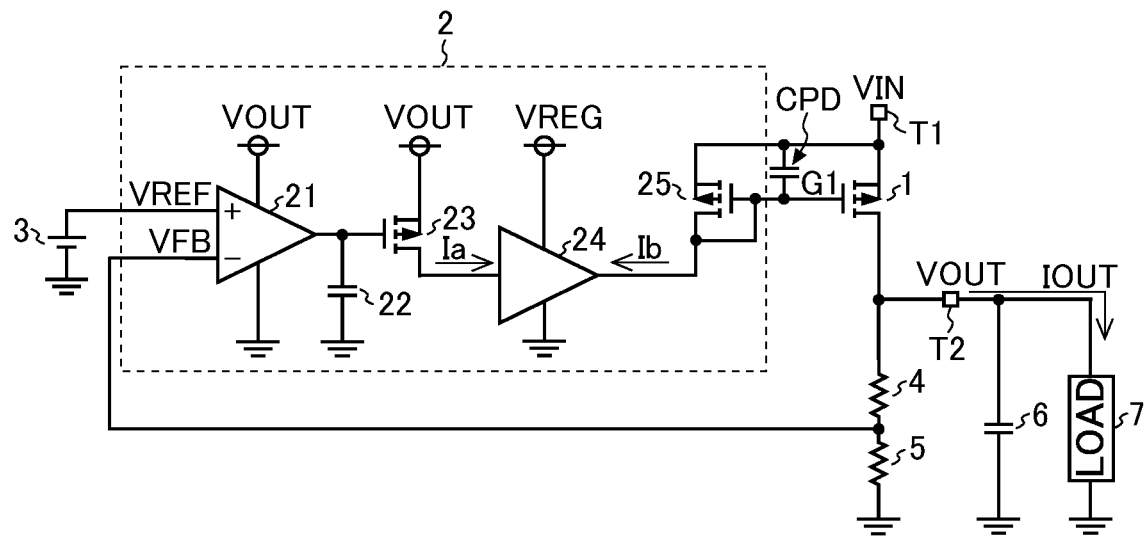
FIG. 1 is a diagram showing the configuration of a linear power supply circuit developed by the present inventor.

FIG. 1 is a diagram showing the configuration of a linear power supply circuit that the present inventor has developed as a linear power supply circuit capable of fast response. The linear power supply circuit shown in FIG. 1 includes an input terminal T1, an output terminal T2, an output transistor 1, a driver 2, a reference voltage generator 3, and resistors 4 and 5.

To the linear power supply circuit shown in FIG. 1, an output capacitor 6 and a load 7 are externally connected. Specifically, the output capacitor 6 and the load 7 are connected, in parallel with each other, externally to the output terminal T2. The linear power supply circuit shown in FIG. 1 bucks (steps down) an input voltage VIN to generate an output voltage VOUT, and supplies the output voltage VOUT to the load 7.

The output transistor 1 is provided between the input terminal T1, to which the input voltage VIN is applied, and the output terminal T2, to which the output voltage VOUT is applied.

The driver 2 drives the output transistor 1. Specifically, the driver 2 feeds a gate signal G1 to the gate of the output transistor 1 and thereby drives the output transistor 1. The conductance (reversely put, on-resistance value) of the output transistor 1 is controlled by the gate signal G1. In the configuration shown in FIG. 1, used as the output transistor 1 is a PMOSFET (P-channel MOSFET). Accordingly, the lower the gate signal G1, the higher the conductance of the output transistor 1, and thus the higher the output voltage VOUT. Put the other way around, the higher the gate signal G1, the lower the conductance of the output transistor 1, and thus the lower the output voltage VOUT. As the output transistor 1, instead of the PMOSFET, a PNP bipolar transistor may be used.

The reference voltage generator 3 generates a reference voltage VREF. The resistors 4 and 5 generate a feedback voltage VFB, which is a division voltage of the output voltage VOUT.

The non-inverting input terminal (+) of the driver 2 is fed with the reference voltage VREF, and the inverting input terminal (−) of the driver 2 is fed with the feedback voltage VFB. The driver 2 drives the output transistor 1 based on the difference ΔV (=VREF−VFB) between the feedback voltage VFB and the reference voltage VREF. As the difference ΔV increases, the driver 2 increases the gate signal G1, and as the difference ΔV decreases, the driver 2 decreases the gate signal G1.

The driver 2 includes a differential amplifier 21, a capacitor 22, a PMOSFET 23, a current amplifier 24, and a PMOSFET 25.

The differential amplifier 21 outputs a voltage commensurate with the difference between the feedback voltage VFB and the reference voltage VREF. The supply voltage for the differential amplifier 21 is the output voltage VOUT. That is, the differential amplifier 21 operates from the voltage between the output voltage VOUT and the ground potential. As the supply voltage for the differential amplifier 21, instead of the output voltage VOUT, a voltage lower than the output voltage VOUT that depends on the output voltage VOUT may be used.

The withstand voltage of the differential amplifier 21 is lower than the withstand voltage of the current amplifier 24. The gain of the differential amplifier 21 is lower than the gain of the current amplifier 24. This helps keep the differential amplifier 21 compact.

One terminal of the capacitor 22 is fed with the output of the differential amplifier 21, and the other terminal of the capacitor 22 is fed with the ground potential.

The source of the PMOSFET 23 is fed with the output voltage VOUT, and the gate of the PMOSFET 23 is fed with a voltage based on the output of the differential amplifier 21 (i.e., the voltage at the connection node between the differential amplifier 21 and the capacitor 22). The PMOSFET 23 converts the voltage based on the output of the differential amplifier 21 into a current and outputs the current from its drain. The connection node between the differential amplifier 21 and the capacitor 22 serves as a negative ground in a high-frequency band, and this helps achieve fast response in the driver 2.

The current amplifier 24 current-amplifies the current Ia output from the drain of the PMOSFET 23. The supply voltage for the current amplifier 24 is a constant voltage VREG. That is, the current amplifier 24 operates from the voltage between the constant voltage VREG and the ground potential.

The PMOSFET 25, together with the output transistor 1, constitutes a current mirror circuit. The PMOSFET 25 converts the current Ib output from the current amplifier 24 into a voltage and feeds the voltage to the gate of the output transistor 1.

Figure 2:
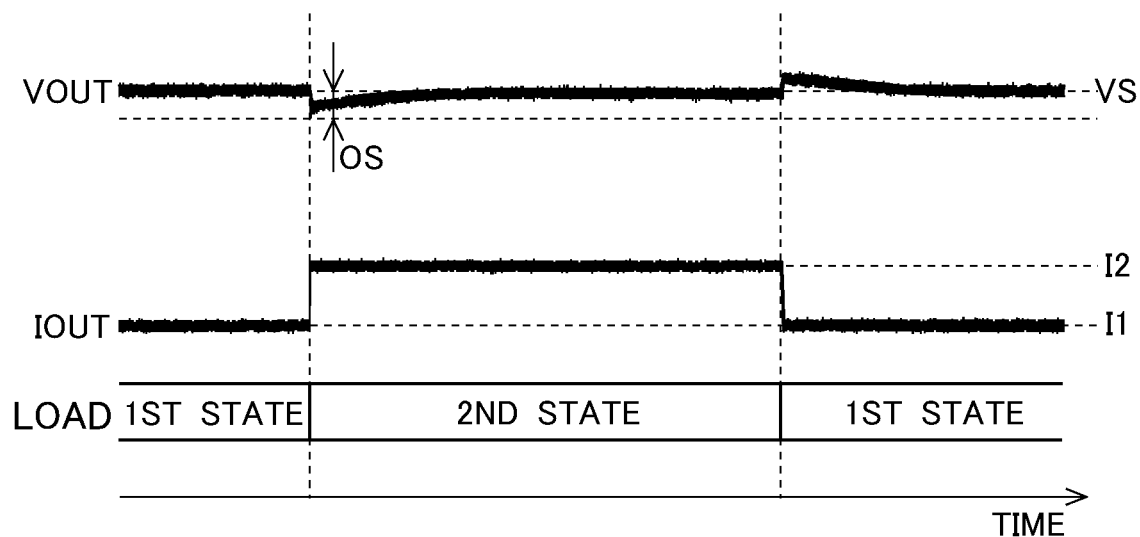
FIG. 2 is a time chart showing the output characteristics of the linear power supply circuit shown in FIG. 1.

FIG. 2 is a time chart showing the output characteristics of the linear power supply circuit shown in FIG. 1. FIG. 2 is a time chart obtained when, assuming that the set value of the output voltage VOUT equals VS and the output capacitor 6 has a predetermined value, the load 7 is switched from a first state to a second state and then back to the first state. The first state is a light-load condition where the theoretical value of the output current IOUT equals I1, and the second state is a heavy-load condition where the theoretical value of the output current IOUT equals I2 (>I1).

The linear power supply circuit shown in FIG. 1 is capable of fast response, and this helps reduce an overshoot OS.

Figure 3:
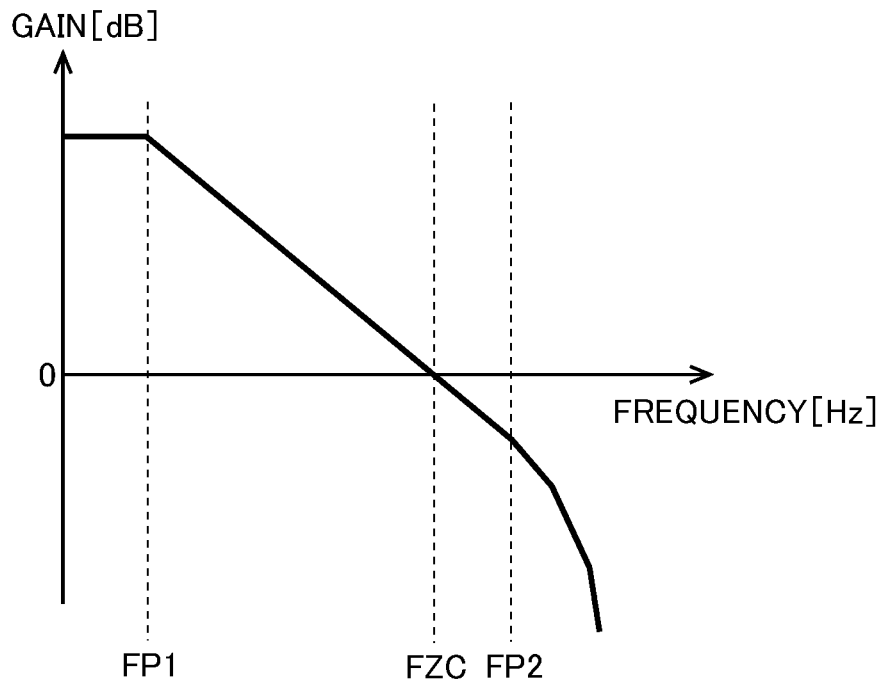
FIG. 3 is a diagram showing the gain characteristics of the transfer function of the linear power supply circuit, the output capacitor, and the load shown in FIG. 1.

FIG. 3 is a diagram showing the gain characteristics of the transfer function of the linear power supply circuit shown in FIG. 1, the output capacitor 6, and the load 7. A first pole frequency FP1 denotes the frequency of a first pole that appears due to the output capacitor 6 and the load 7. A second pole frequency FP2 denotes the frequency of a second pole that appears due to a parasitic capacitance CPD formed between the source and the gate of the output transistor 1.

With the transfer function shown in FIG. 3, the zero-cross frequency FZC is low, and the second pole frequency FP2 appears in a region where the gain is negative. This makes phase compensation easy.

Figure 4:
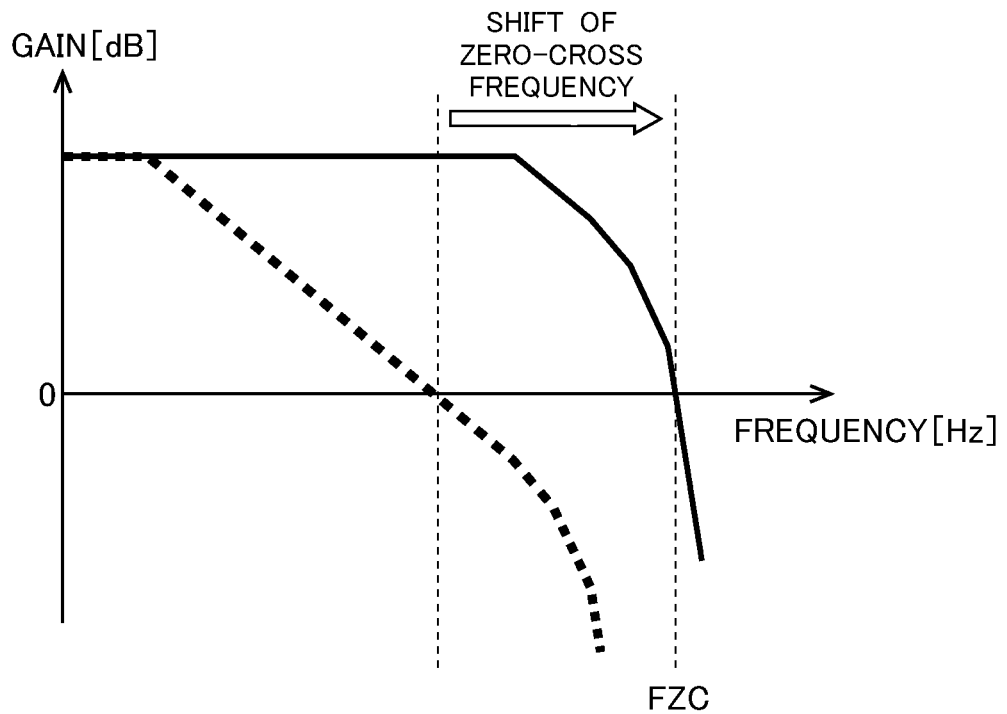
FIG. 4 is a diagram showing the gain characteristics of the transfer function of the linear power supply circuit, the output capacitor, and the load shown in FIG. 1.

By contrast, if the output capacitor 6 is removed, the first pole frequency FP1, which contributes to the adjustment of the gain, disappears; thus the zero-cross frequency FZC shifts to a higher region. As a result the gain characteristics of the transfer function of the linear power supply circuit shown in FIG. 1, the output capacitor 6, and the load 7 are then as shown in FIG. 4. In FIG. 4, for comparison, the gain characteristics shown in FIG. 3 are indicated by a thick dotted line.

With the gain characteristics shown in FIG. 4, due to the zero-cross frequency FZC shifted to a higher region, a plurality of poles appear in a region where the gain is positive. This makes phase compensation difficult.

2. First Embodiment

Figure 5:
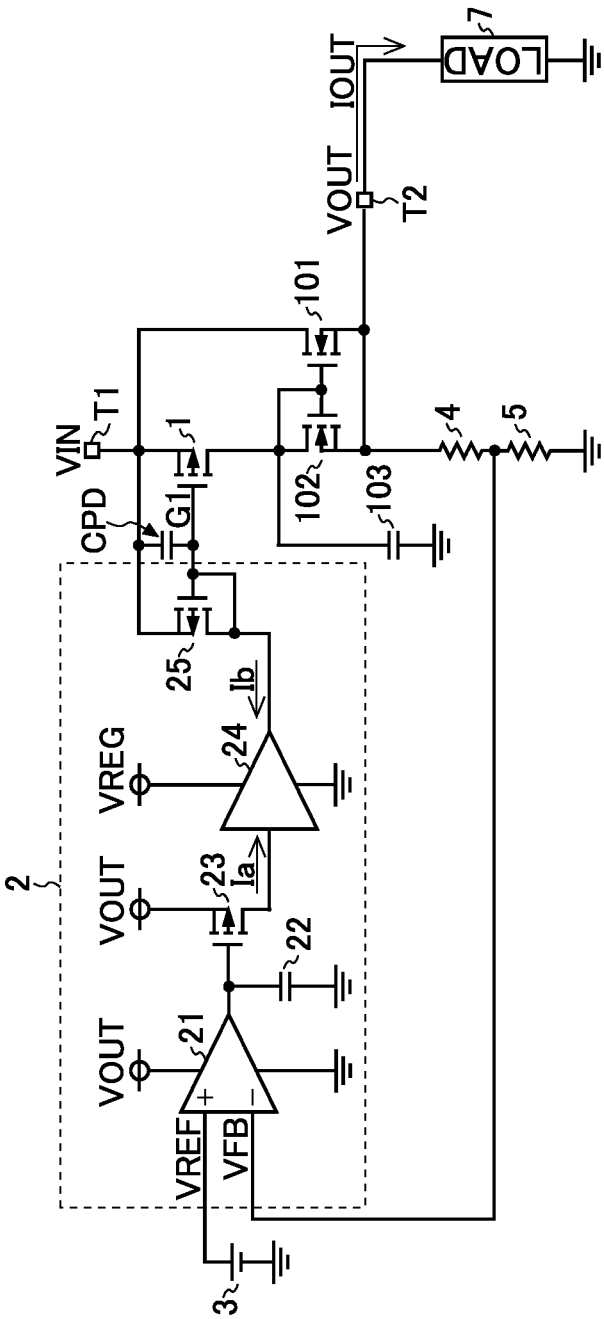
FIG. 5 is a diagram showing the configuration of a linear power supply circuit according to a first embodiment.

FIG. 5 is a diagram showing a linear power supply circuit according to a first embodiment, which the present inventor has developed to solve the problems with the linear power supply circuit shown in FIG. 1. In FIG. 5, such parts as find their counterparts in FIG. 1 are identified by the same reference signs, and no detailed description will be repeated.

The linear power supply circuit shown in FIG. 5 differs from the linear power supply circuit shown in FIG. 1 in that it includes NMOSFETs 101 and 102 and a capacitor 103. Instead of the NMOSFETs 101 and 102, NPN bipolar transistors may be used. While there is no particular restriction on the withstand voltage of the NMOSFET 101, the NMOSFET 101 can be given a withstand voltage of 10 V or more so that it can cope with, for example, an input voltage VIN over 5 V.

In the linear power supply circuit shown in FIG. 5, as in the linear power supply circuit shown in FIG. 1, the connection node between the differential amplifier 21 and the capacitor 22 serves as a negative ground in a high-frequency band. This helps achieve fast response in the driver 2.

The withstand voltages of the differential amplifier 21 and the PMOSFET 23 are lower than the withstand voltage of the current amplifier 24. The gain of the differential amplifier 21 is lower than the gain of the current amplifier 24. This helps keep the differential amplifier 21 and the PMOSFET 23 compact.

The withstand voltage of the PMOSFET 23 is lower than the withstand voltage of the current amplifier 24. This helps keep the PMOSFET 23 compact.

Figure 6:
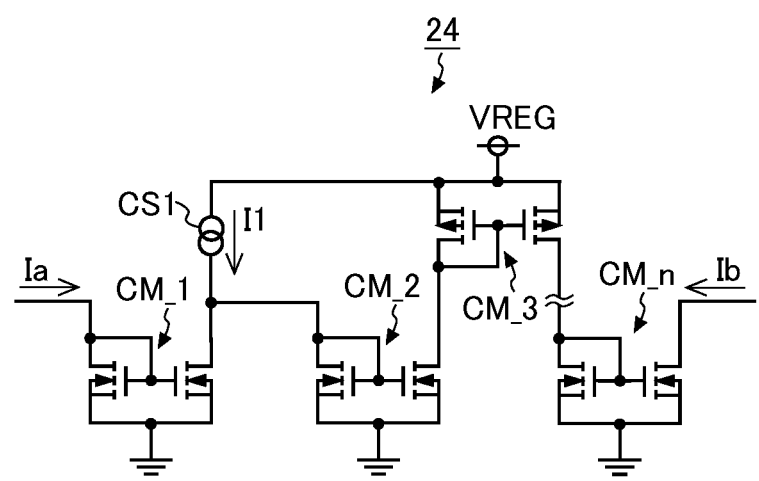
FIG. 6 is a diagram showing one configuration example of a current amplifier.

FIG. 6 is a diagram showing one configuration example of the current amplifier 24. The current amplifier 24 of the configuration example shown in FIG. 6 includes current-sink current mirror circuits CM_1, CM_2, ... CM_n and current-source current mirror circuits CM_3, ... CM_n−1 (of which CM_n−1 is not shown in FIG. 6). Between, at one end, the current-sink current mirror circuit CM_1 and a current source CS1 that produces a constant current I1 and, at the other end, the current-sink current mirror circuit CM_n, from the input to the output of the current amplifier 24, the current-sink and current-source current mirror circuits are arranged alternately. To keep the pole that appears in each of the current mirror circuits as far away as possible from a low frequency band, each current mirror circuit is given, preferably, a mirror ratio (the ratio of the size of the output-side transistor to the size of the input-side transistor) of 5 or less and, more preferably, 3 or less. It should however be noted that, the smaller the mirror ratio of each current mirror circuit, the larger the circuit area of the current amplifier 24. Thus the mirror ratio of each current mirror circuit can be determined with consideration given to the trade-off between improved frequency characteristics and compactness.

Referring back to FIG. 5, the NMOSFETs 101 and 102 and the capacitor 103 will be described. The drain of the NMOSFET 101 is connected to the input terminal T1. The source of the NMOSFET 101 is connected to the output terminal T2. Thus the NMOSFET 101 forms a source follower circuit. The drain of the NMOSFET 102, the respective gates of the NMOSFETs 101 and 102, and one terminal of the capacitor 103 are connected to the drain of the output transistor 1. The source of the NMOSFET 102 is connected to the output terminal T2. The other terminal of the capacitor 103 is fed with the ground potential.

In the linear power supply circuit shown in FIG. 5, since the NMOSFET 101 that forms a source follower circuit is in the final stage, the output impedance is low. To the gate of the NMOSFET 101, the capacitor 103 is connected and, by a current mirror circuit constituted by the NMOSFETs 101 and 102, the NMOSFET 101 is driven. Thus it is possible, while retaining fast response performance in the driver 2, to produce a first pole at a frequency comparable with that of the first pole frequency FP1 in FIG. 3.

The linear power supply circuit shown in FIG. 5 is capable of fast response and can achieve stability of the output voltage VOUT despite having no output capacitor 6 (see FIG. 1) externally connected to it.

Moreover, in the linear power supply circuit shown in FIG. 5, the reciprocal (1/gm) of the transconductance of the NMOSFET 102 can be made sufficiently high compared with the impedance of the load 7, and this makes it possible to give the capacitor 103 so low a capacitance (e.g., less than 20 pF) that it can be incorporated in a semiconductor integrated circuit device.

Moreover, in the linear power supply circuit shown in FIG. 5, the reciprocal (1/gm) of the transconductance of the NMOSFET 101 and the reciprocal (1/gm) of the transconductance of the NMOSFET 102 are proportional to the impedance of the load 7, and this, as in the linear power supply circuit shown in FIG. 1, helps maintain the characteristics of the zero-cross frequency rising in accordance with the impedance of the load 7. Generally, with a transient load (a load that exhibits electric power consumption with a rectangular waveform), as the output load of a linear power supply circuit increases, the output voltage exhibits an accordingly large drop. With a high zero-cross frequency, however, fast response is achieved with a transient load, and this helps reduce the drop in the output voltage to the transient load. With the linear power supply circuit shown in FIG. 5, as mentioned above, the heavier the load, the higher the zero-cross frequency. Accordingly, with the linear power supply circuit shown in FIG. 5, a transient increase in load can be coped with a smaller drop in the output voltage as compared with common linear power supply circuits. In a linear power supply circuit, raising the zero-cross frequency requires a higher circuit current. However, when the transient load is light, even with a low zero-cross frequency, the drop in the output voltage is small. Thus it is unnecessary to keep a high zero-cross frequency by consuming extra circuit current. With the linear power supply circuit shown in FIG. 5, as described above, a light load brings a low zero-cross frequency. Thus, with the linear power supply circuit shown in FIG. 5, it is possible to suppress the current consumed under no load (dark current) as compared with common linear power supply circuits.

Figure 7A:
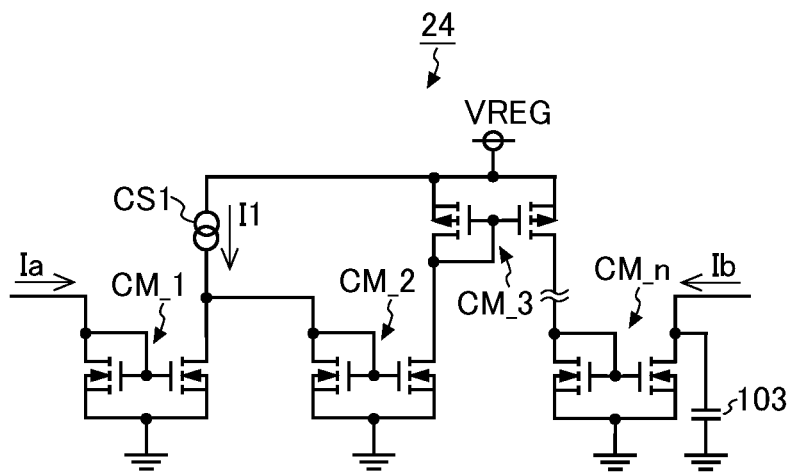
FIG. 7A is a diagram illustrating a modified example of the first embodiment.
Figure 7B:
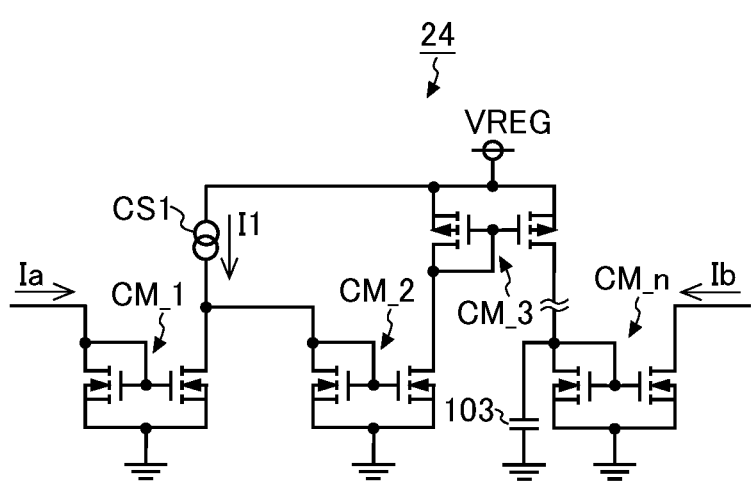
FIG. 7B is a diagram illustrating another modified example of the first embodiment.
Figure 7C:
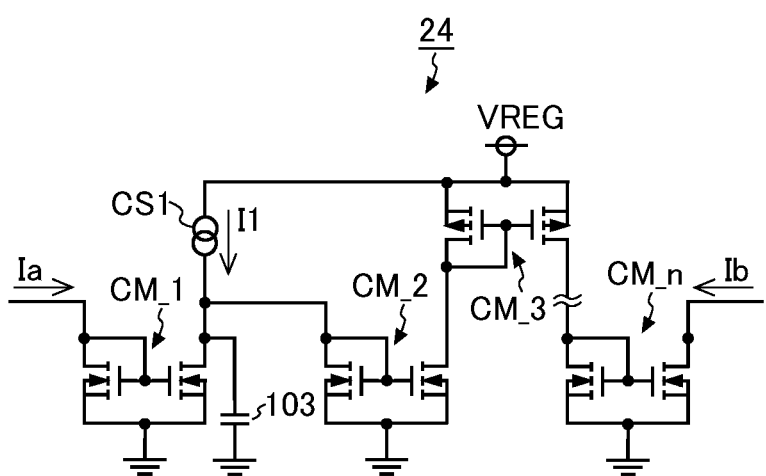
FIG. 7C is a diagram illustrating yet another modified example of the first embodiment.

The capacitor 103 can be connected to anywhere than to the gates of the NMOSFETs 101 and 102; it can instead be connected, for example as shown in FIGS. 7A to 7C, to a current-sink current mirror circuit within the current amplifier 24. Connecting the capacitor 103 to the gate of the NMOSFET 101 gives optimal fast response performance. On the other hand, the closer to the PMOSFET 23 (see FIG. 5) the capacitor 103 is connected, the lower capacitance the capacitor 103 can be given.

3. Second Embodiment

Figure 8A:
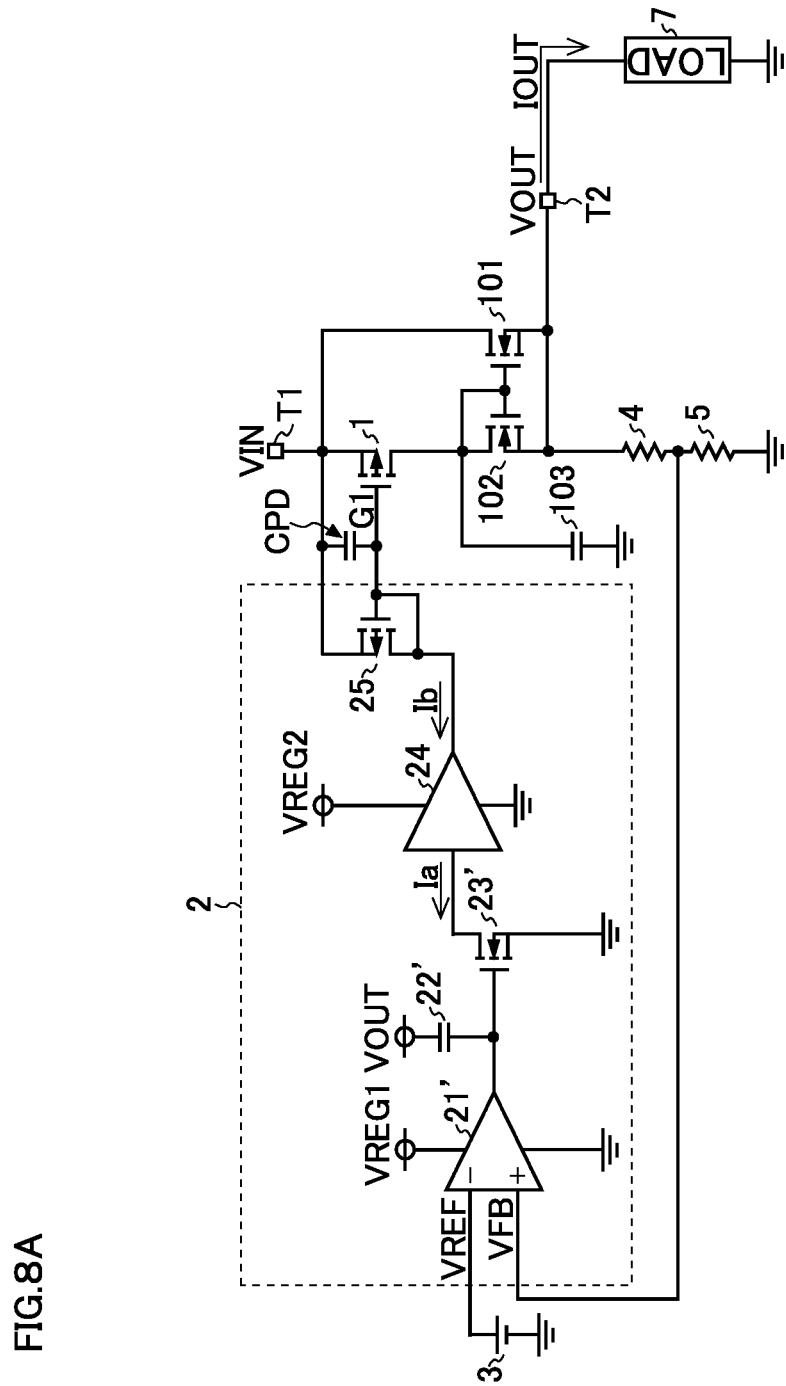
FIG. 8A is a diagram showing the configuration of a linear power supply circuit according to a second embodiment.

FIG. 8A is a diagram showing the configuration of a linear power supply circuit according to a second embodiment. In FIG. 8A, such parts as find their counterparts in FIG. 5 are identified by the same reference signs, and no detailed description will be repeated.

In this embodiment, the driver 2 includes a differential amplifier 21', a capacitor 22', a NMOSFET 23', a current amplifier 24, and a PMOSFET 25.

The differential amplifier 21' outputs a voltage commensurate with the difference between the feedback voltage VFB and the reference voltage VREF. The supply voltage for the differential amplifier 21' is a first constant voltage VREG1. That is, the differential amplifier 21' operates from the voltage between the first constant voltage VREG1 and the ground potential.

The withstand voltages of the differential amplifier 21' and the NMOSFET 23' are lower than the withstand voltage of the current amplifier 24. The gain of the differential amplifier 21' is lower than the gain of the current amplifier 24. This helps keep the differential amplifier 21' and the NMOSFET 23' compact.

One terminal of the capacitor 22' is fed with the output of the differential amplifier 21', and the other terminal of the capacitor 22' is fed with the output voltage VOUT. Instead of the output voltage VOUT, a voltage that depends on the output voltage VOUT may be fed to the other terminal of the capacitor 22'.

The source of the NMOSFET 23' is fed with the ground potential, and the gate of the NMOSFET 23' is fed with a voltage based on the output of the differential amplifier 21' (i.e., the voltage at the connection node between the differential amplifier 21' and the capacitor 22'). The NMOSFET 23' converts the voltage based on the output of the differential amplifier 21' into a current and outputs the current from its drain. The connection node between the differential amplifier 21' and the capacitor 22' serves as a positive (VOUT) ground in a high-frequency band, and this helps achieve fast response in the driver 2.

Figure 8B:
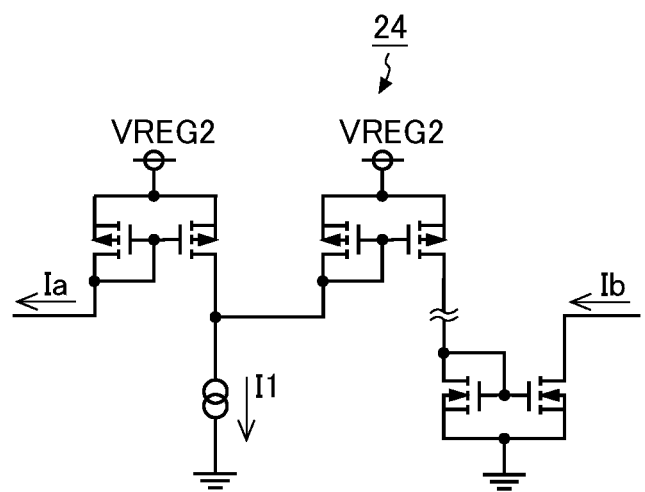
FIG. 8B is a diagram showing another configuration example of a current amplifier.

The current amplifier 24 current-amplifiers the current Ia output from the drain of the NMOSFET 23'. The supply voltage for the current amplifier 24 is a second constant voltage VREG2. That is, the current amplifier 24 operates from the voltage between the second constant voltage VREG2 and the ground potential. The first and second constant voltages VREG1 and VREG2 may have equal values or may have different values. In this configuration example, the current Ia passes from the current amplifier 24 toward the NMOSFET 23', and thus the current amplifier 24 can be given, for example, a circuit configuration as shown in FIG. 8B.

The linear power supply circuit according to this embodiment shown in FIG. 8A provides benefits similar to those of the linear power supply circuit shown in FIG. 5 at the first embodiment. Moreover, the linear power supply circuit according to this embodiment shown in FIG. 8A ensures that the differential amplifier 21' operates even in a case where the set value of the output voltage VOUT is low. In a case where a low voltage is used as the input voltage VIN, instead of the first constant voltage VREG1 the input voltage VIN can be used as the supply voltage for the differential amplifier 21', and instead of the second constant voltage VREG2 the input voltage VIN can be used as the supply voltage for the current amplifier 24.

4. Third Embodiment

Figure 9A:
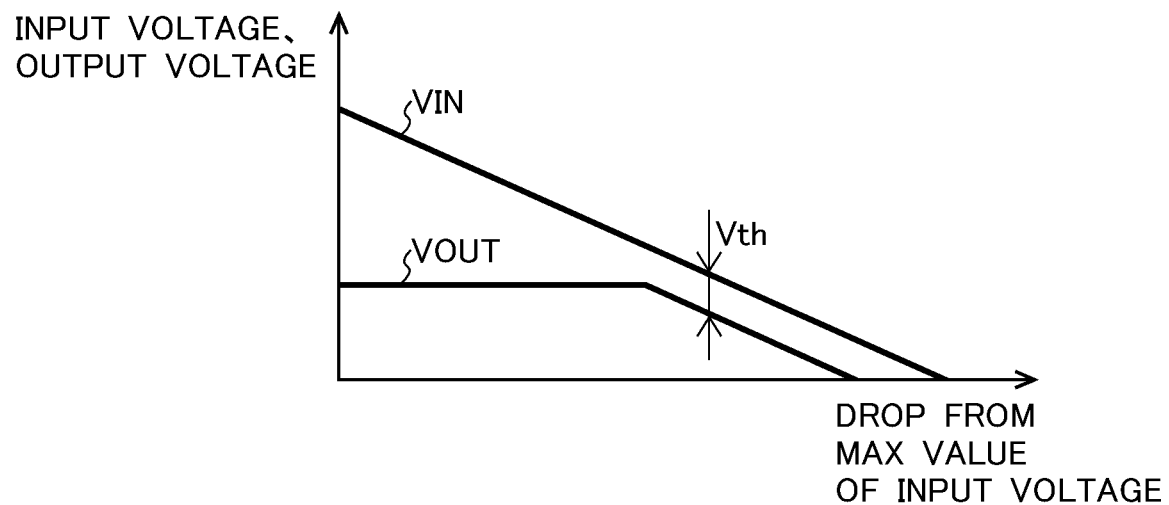
FIG. 9A is a diagram showing the input-output characteristics of the linear power supply circuit shown in FIG. 1.

With the linear power supply circuits shown in FIGS. 5 and 8, when as shown in FIG. 9A the input voltage VIN falls to a value close to the output voltage VOUT, the output voltage VOUT falls below the input voltage VIN by the threshold voltage Vth of the NMOSFET 101. However, ideal input-output characteristics desired in LDO power supply circuits are such that, as shown in FIG. 9B, when the input voltage VIN falls to a value close to the output voltage VOUT, the output voltage VOUT hardly falls below the input voltage VIN.

Figure 9B:
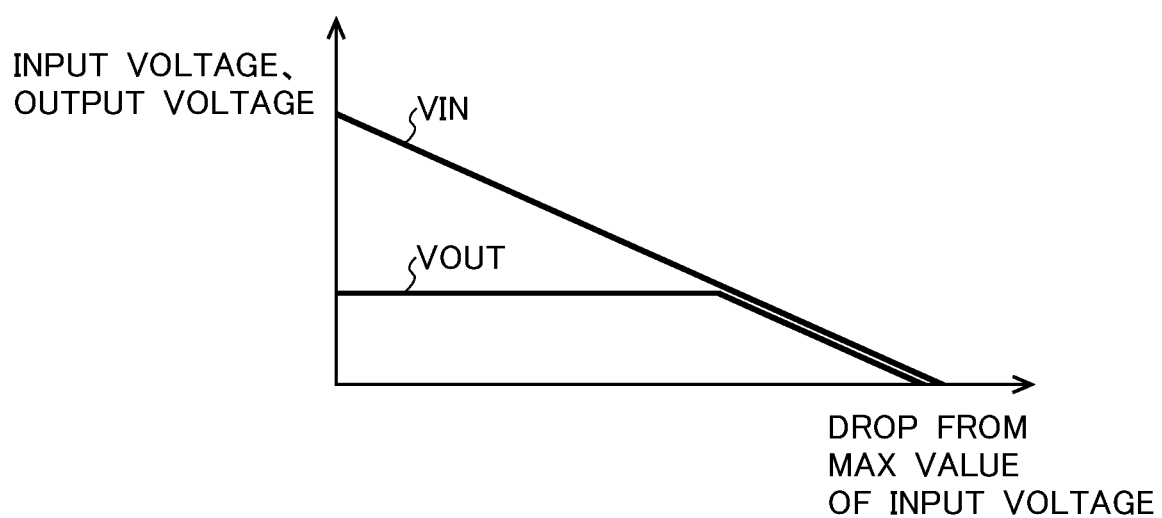
FIG. 9B is a diagram showing ideal input-output characteristics of a linear power supply circuit.
Figure 10:
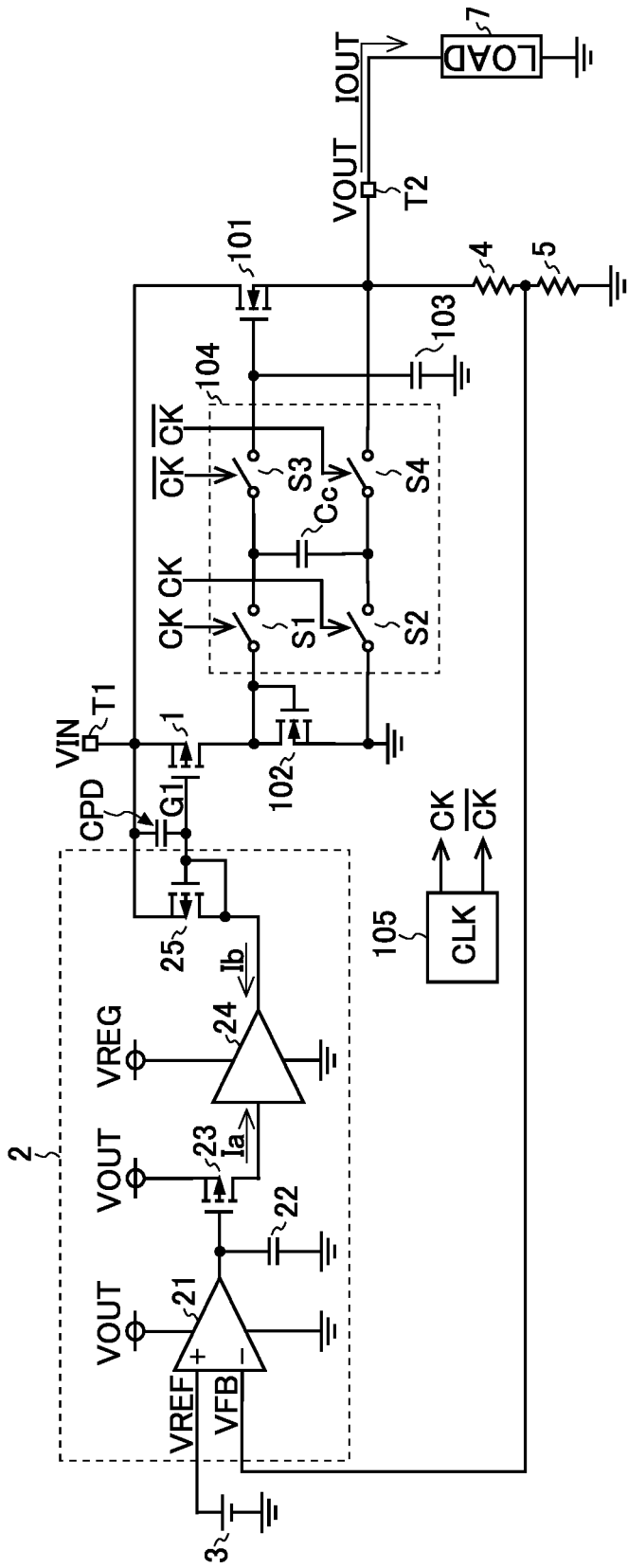
FIG. 10 is a diagram showing the configuration of a linear power supply circuit according to a third and a fourth embodiment.

The linear power supply circuit according to the third embodiment is a power supply circuit that offers input-output characteristics close to ideal characteristics as shown in FIG. 9B. FIG. 10 is a diagram showing the configuration of a linear power supply circuit according to the third embodiment. In FIG. 10, such parts as find their counterparts in FIG. 5 are identified by the same reference signs, and no detailed description will be repeated.

The linear power supply circuit shown in FIG. 10 differs from the linear power supply circuit shown in FIG. 5 in that it includes a charge pump circuit 104 and a clock signal generation circuit 105. In the linear power supply circuit shown in FIG. 10, the input terminal T1, the output terminal T2, the NMOSFET 101, and the charge pump circuit 104 constitute a source follower circuit.

The charge pump circuit 104 is provided between the NMOSFETs 102 and 101. The charge pump circuit 104 includes switches S1 to S4 and a capacitor Cc. The switches S1 and S2 are turned on and off by a clock signal CK. The switches S3 and S4 are turned on and off by an inverted clock signal bar-CK. As a result of the charge pump circuit 104 operating based on the clock signal CK and the inverted clock signal bar-CK, a voltage which is the sum of the source voltage of the NMOSFET 101 and the gate-source voltage of the NMOSFET 102 is fed to the gate of the NMOSFET 101.

As described above, in the linear power supply circuit shown in FIG. 10, the charge pump circuit 104 drives the NMOSFET 101. Accordingly, in the linear power supply circuit shown in FIG. 10, the gate voltage of the NMOSFET 101 can be made higher than the input voltage VIN. It is thus possible to reduce the drop in the output voltage VOUT (the difference between the input voltage VIN and the output voltage VOUT) when the input voltage VIN falls.

As described above, the charge pump circuit 104 drives the NMOSFET 101. Accordingly the source follower circuit constituted by the input terminal T1, the output terminal T2, the NMOSFET 101, and the charge pump circuit 104 permits the gate voltage of the NMOSFET 101 to be higher than the input voltage VIN. Thus this source follower circuit can reduce the drop in the source voltage of the transistor NMOSFET 101 (the difference between the input voltage VIN and the source voltage of the transistor NMOSFET 101) when the input voltage VIN falls. With the linear power supply circuit shown in FIG. 10, owing to its including the source follower circuit described above, it is possible to reduce the drop in the output voltage VOUT (the difference between the input voltage VIN and the output voltage VOUT) when the input voltage VIN falls.

The charge pump circuit 104 can be linearly approximated to an RC circuit, and thus the frequency of the pole that appears due to the charge pump circuit 104 varies with the frequency of the clock signal CK. Accordingly, by appropriately setting the frequency of the clock signal CK, it is possible to achieve in the linear power supply circuit shown in FIG. 10 fast response characteristics similar to those of the linear power supply circuit shown in FIG. 5.

The modification from the linear power supply circuit shown in FIG. 5 to the linear power supply circuit shown in FIG. 10 can be applied equally to the linear power supply circuit shown in FIG. 8A.

Figure 11:
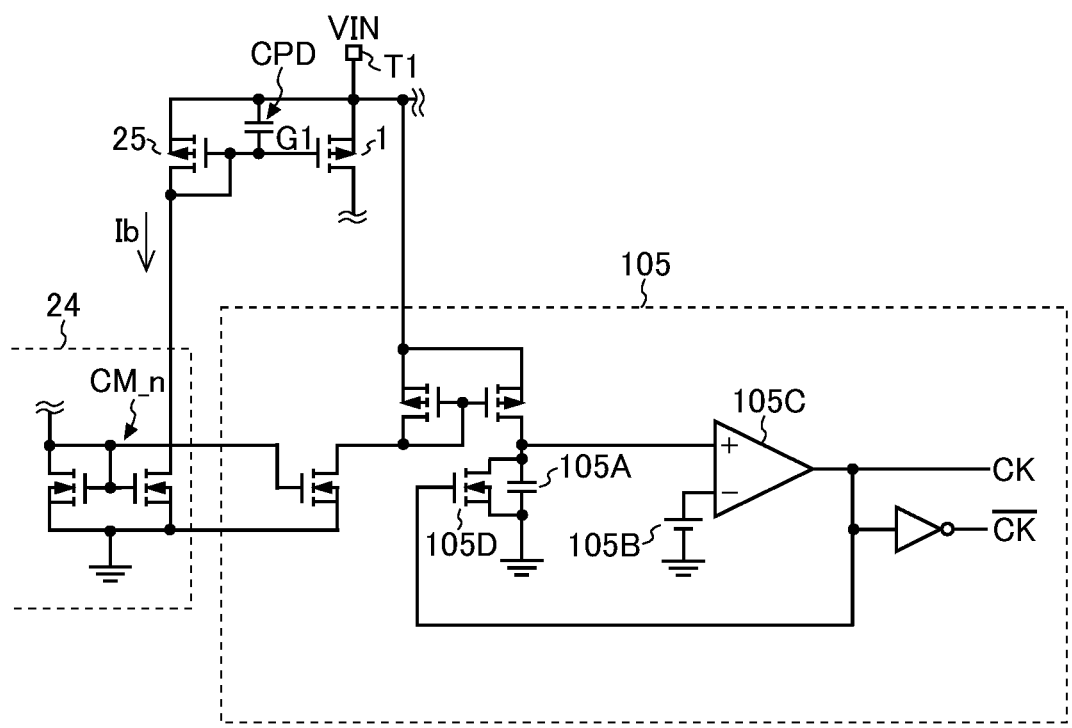
FIG. 11 is a diagram showing one configuration example of a clock signal generation circuit used in the third embodiment.

Next, the clock signal generation circuit 105 will be described. FIG. 11 is a diagram showing one configuration example of the clock signal generation circuit 105. The clock signal generation circuit 105 of the configuration example shown in FIG. 11 includes a capacitor 105A, a reference voltage source 105B, a comparator 105C, and a discharge transistor 105D.

The capacitor 105A is charged by a charge current that depends on the current Ib output from the current amplifier 24. The current Ib depends on the output current IOUT, and thus the charging speed of the capacitor 105A depends on the output current IOUT. The comparator 105C outputs as the clock signal CK the result of comparison of the charge voltage of the capacitor 105A with a reference voltage output from the reference voltage source 105B. When the clock signal CK turns to high level, the discharge transistor 105D turns on, and the capacitor 105A is discharged. In the clock signal generation circuit 105 of the configuration example shown in FIG. 11, the inverted clock signal bar-CK, which is the inversion signal of the clock signal CK, is also generated.

In the clock signal generation circuit 105 of the configuration example shown in FIG. 11, the higher the output current IOUT, the higher the clock frequency of the clock signal CK. It is thus possible, in a no-load condition (when the impedance of the load 7 can be regarded as infinitely high), to suppress the power consumption by the charge pump circuit 104 and, when responding to a load, to achieve fast operation in the charge pump circuit 104.

Instead of the clock signal generation circuit 105 of the configuration example shown in FIG. 11, it is also possible to use clock signal generation circuits as described under (1) to (4) below:

(1) A clock signal generation circuit that compares the output voltage VOUT with a reference voltage and that, when the output voltage VOUT is lower than the reference voltage, generates the clock signal CK and the inverted clock signal bar-CK.

(2) A clock signal generation circuit that compares the value resulting from subtracting the output voltage VOUT from the input voltage VIN with a reference voltage and that, when the value resulting from subtracting the output voltage VOUT from the input voltage VIN is smaller than the reference voltage, generates the clock signal CK and the inverted clock signal bar-CK.

(3) A clock signal generation circuit that compares the ratio of the output voltage VOUT to the input voltage VIN with a reference voltage and that, when the ratio of the output voltage VOUT to the input voltage VIN is greater than the reference voltage, generates the clock signal CK and the inverted clock signal bar-CK.

(4) A clock signal generation circuit that, when it receives a signal instructing to generate a clock signal (e.g., a signal that is output from a vehicle-mounted microcomputer when the vehicle is started), generates the clock signal CK and the inverted clock signal bar-CK.

When the clock signal generation circuit does not generate the clock signal CK and the inverted clock signal bar-CK, the switches S1 and S3 can be turned on, for example, by a high-level signal. This can be achieved by providing, for example, a voltage source that outputs a high-level signal when the clock signal generation circuit does not generate the clock signal CK and the inverted clock signal bar-CK, an OR gate that feeds the switch S1 with the OR (logical sum) of the high-level signal and the clock signal CK, an OR gate that feeds the switch S3 with the OR of the high-level signal and the inverted clock signal bar-CK, and an additional switch. The additional switch is provided between the connection node of the source of the NMOSFET 102 with one terminal of the switch S2 and the ground potential. The additional switch is on in a first mode, which will be described later, and is off in a second mode, which will be described later. This allows switching between the first mode, in which a charge pump circuit operates, and the second mode, in which the charge pump circuit does not operate and the gate of the NMOSFET 101 and the NMOSFET 102 are at equal potentials. The second mode yields an output voltage VOUT with no switching ripples.

5. Fourth Embodiment

The clock signal generation circuit 105 of the configuration example shown in FIG. 11, that is, the one used in the third embodiment, presupposes that the output current IOUT is a source current that passes out via the output terminal T2 toward the load 7. Accordingly, if an extraneous leak current or the output current IOUT passes in via the output terminal T2, the clock signal generation circuit 105 of the configuration example shown in FIG. 11 does not operate, and the output voltage VOUT rises.

Figure 12:
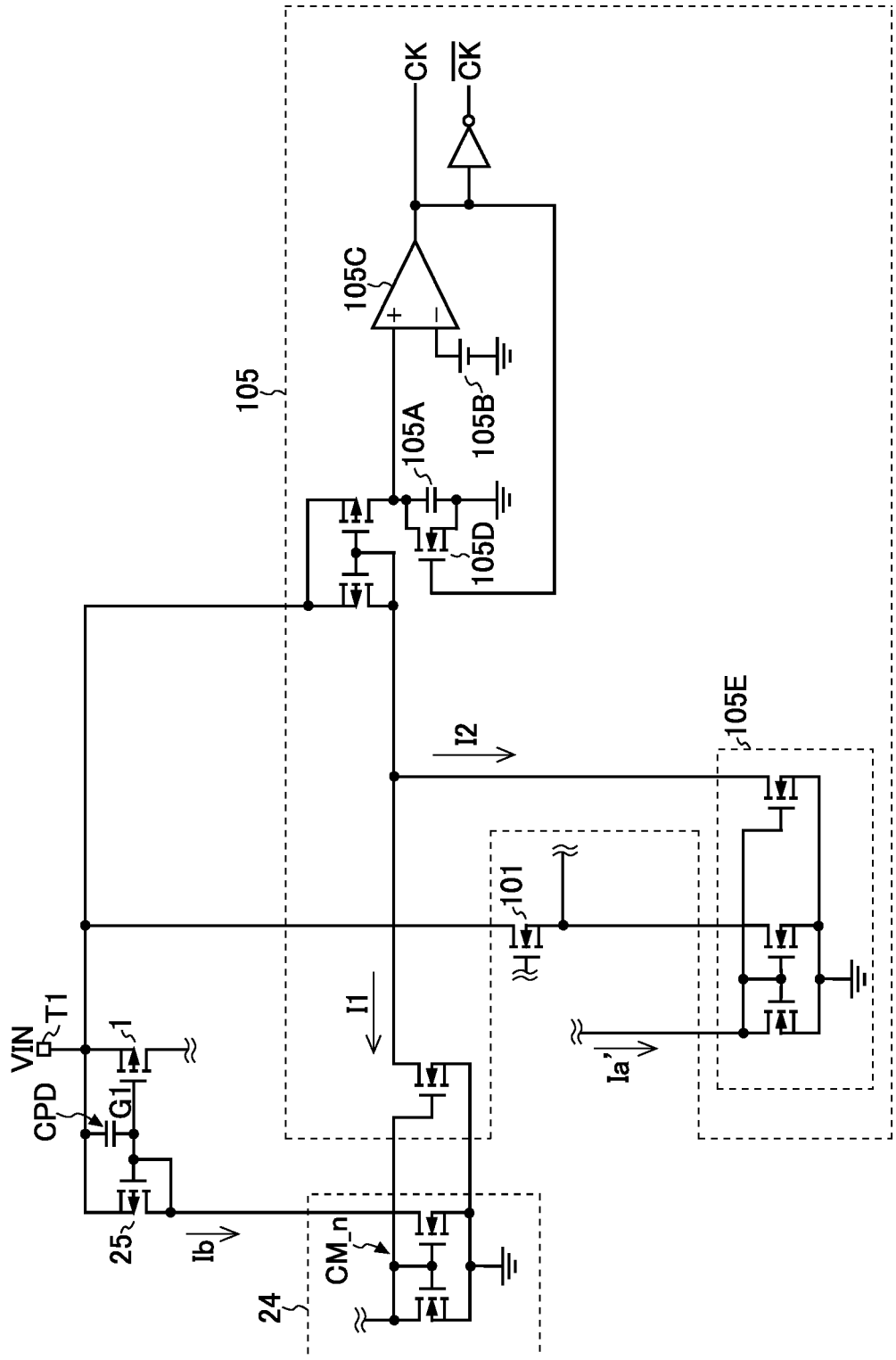
FIG. 12 is a diagram showing one configuration example of a clock signal generation circuit used in the fourth embodiment.

A linear power supply circuit according to a fourth embodiment is a power supply circuit with which, irrespective of whether the output current IOUT is a source current or a sink current, the clock signal generation circuit 105 and the charge pump circuit 104 can operate and the output voltage VOUT is prevented from rising. FIG. 12 shows one configuration example of the clock signal generation circuit 105 used in a linear power supply circuit according to the fourth embodiment. The overall configuration of the linear power supply circuit according to the fourth embodiment is similar to the overall configuration of the linear power supply circuit according to the third embodiment, and is as shown in FIG. 10.

The clock signal generation circuit 105 of the configuration example shown in FIG. 12, as compared with the clock signal generation circuit 105 of the configuration example shown in FIG. 11, additionally includes a current mirror circuit 105E. The current mirror circuit 105E generates a current I2 from a current Ia'. The current Ia' is a mirror current of the current Ia (see FIG. 10). That is, the linear power supply circuit according to the fourth embodiment includes a current mirror circuit (not illustrated) that generates the current Ia' from the current Ia.

In FIG. 12, the current I1 is a current that depends on the output current IOUT as a source current. In FIG. 12, the current I2 is a current that depends on the output current IOUT as a sink current. The capacitor 105A is charged by a charge current that depends on the scalar sum of the currents I1 and I2, that is, a charge current that depends on the scalar sum of the output current IOUT as a source current and the output current IOUT as a sink current. Thus the clock signal generation circuit 105 of the configuration example shown in FIG. 12 operates irrespective of whether the output current IOUT is a source current or a sink current.

The output current IOUT as a source current and the output current IOUT as a sink current do not occur simultaneously, and thus the instantaneous value of the scalar sum of the output current IOUT as a source current and the output current IOUT as a sink current is that of either the output current IOUT as a source current or the output current IOUT as a sink current.

6. Fifth Embodiment

Figure 13:
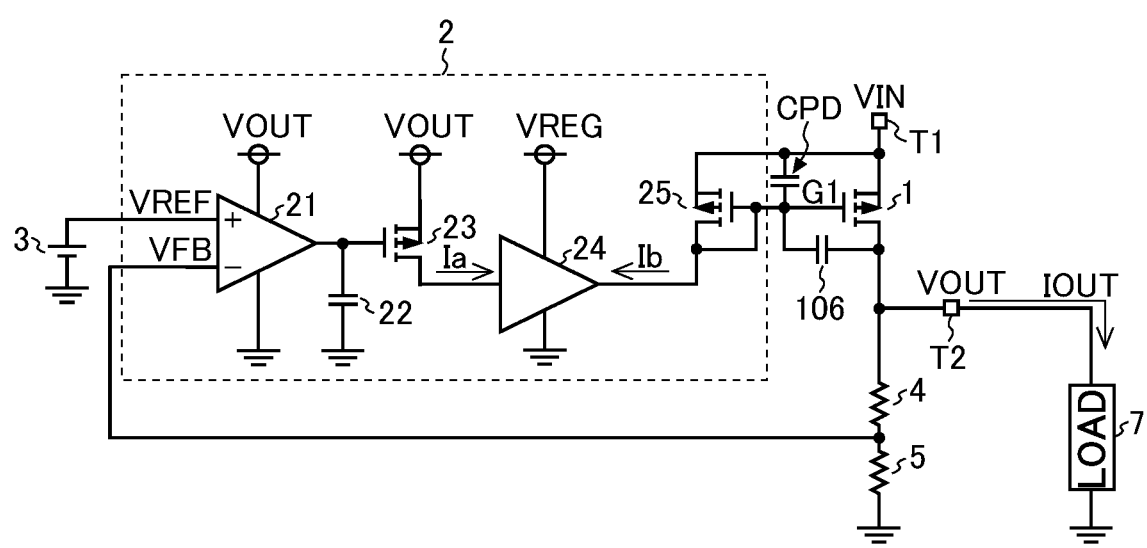
FIG. 13 is a diagram showing the configuration of a linear power supply circuit according to a fifth embodiment.

A linear power supply circuit according to a fifth embodiment is, like the linear power supply circuits according to the third and fourth embodiments, a power supply circuit that exhibits input-output characteristics close to ideal characteristics as shown in FIG. 9B. FIG. 13 is a diagram showing the configuration of a linear power supply circuit according to the fifth embodiment. In FIG. 13, such parts as find their counterparts in FIG. 1 are identified by the same reference signs, and no detailed description will be repeated.

The linear power supply circuit shown in FIG. 13 differs from the linear power supply circuit shown in FIG. 5 in that it includes, instead of the NMOSFETs 101 and 102 and the capacitor 103, a capacitor 106.

The capacitor 106 is provided between the gate and the drain of the output transistor 1, which is a PMOSFET. That is, one terminal of the capacitor 106 is connected to the gate of the output transistor 1, and the other terminal of the capacitor 106 is connected to the drain of the output transistor 1.

With the linear power supply circuit shown in FIG. 13, unlike the linear power supply circuits shown in FIGS. 5 and 8A, owing to the omission of the NMOSFETs 101 and 102, even when the input voltage VIN falls to a value close to the output voltage VOUT, the output voltage VOUT does not fall below the input voltage VIN by the threshold voltage Vth of the NMOSFET 101.

Moreover, when the load 7 varies sharply, that is, when the linear power supply circuit shown in FIG. 13 operates at a high frequency, the capacitor 106 is short-circuited. Thus, when the output voltage VOUT (the drain voltage of the output transistor 1) falls sharply with respect to the load 7, the gate-source voltage of the output transistor 1 becomes higher than the threshold voltage of the output transistor 1 and, regardless of the output of the driver 2, the output transistor 1 turns on. Thus the linear power supply circuit shown in FIG. 13 is capable of fast response.

Moreover, the linear power supply circuit shown in FIG. 13 offers frequency characteristics similar to those of the linear power supply circuits shown in FIGS. 5 and 8A. That is, with the linear power supply circuit shown in FIG. 13, phase compensation is easy.

Moreover, the linear power supply circuit shown in FIG. 13, unlike the linear power supply circuit shown in FIG. 10, does not include a charge pump circuit, and thus in principle does not generate switching noise from a charge pump circuit.

7. Sixth Embodiment

Figure 14:
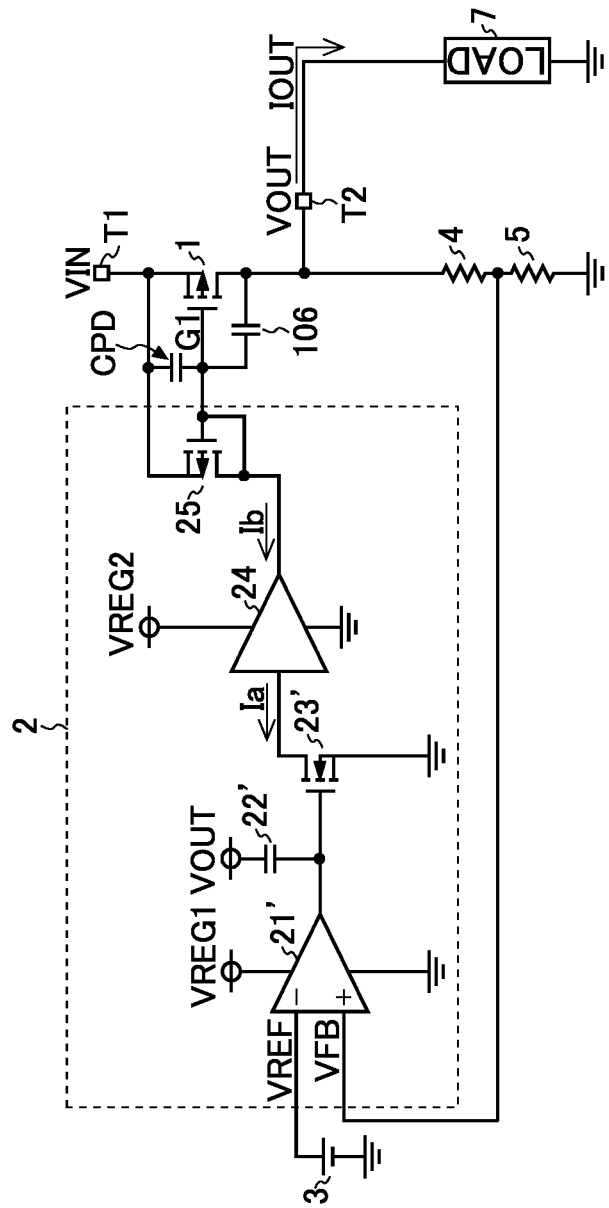
FIG. 14 is a diagram showing the configuration of a linear power supply circuit according to a sixth embodiment.

A linear power supply circuit according to a sixth embodiment, like the linear power supply circuits according to the third to fifth embodiments, is a power supply circuit that offers input-output characteristics close to ideal characteristics as shown in FIG. 9B. FIG. 14 is a diagram showing the configuration of a linear power supply circuit according to the sixth embodiment. In FIG. 14, such parts as find their counterparts in FIG. 8A are identified by the same reference signs, and no detailed description will be repeated.

The linear power supply circuit shown in FIG. 14 differs from the linear power supply circuit shown in FIG. 8A in that it includes, instead of the NMOSFETs 101 and 102 and the capacitor 103, a capacitor 106.

The capacitor 106 is provided between the gate and the drain of the output transistor 1, which is a PMOSFET. That is, one terminal of the capacitor 106 is connected to the gate of the output transistor 1, and the other terminal of the capacitor 106 is connected to the drain of the output transistor 1.

The linear power supply circuit according to this embodiment shown in FIG. 14 provides benefits similar to those of the linear power supply circuit according to the fifth embodiment shown in FIG. 13. Moreover, the linear power supply circuit shown in FIG. 14 ensures that, even in a case where the set value of the output voltage VOUT is low, the differential amplifier 21' operates. In a case where a low voltage is used as the input voltage VIN, instead of the first constant voltage VREG1 the input voltage VIN can be used as the supply voltage for the differential amplifier 21', and instead of the second constant voltage VREG2 the input voltage VIN can be used as the supply voltage for the current amplifier 24.

8. Seventh Embodiment

Figure 15A:
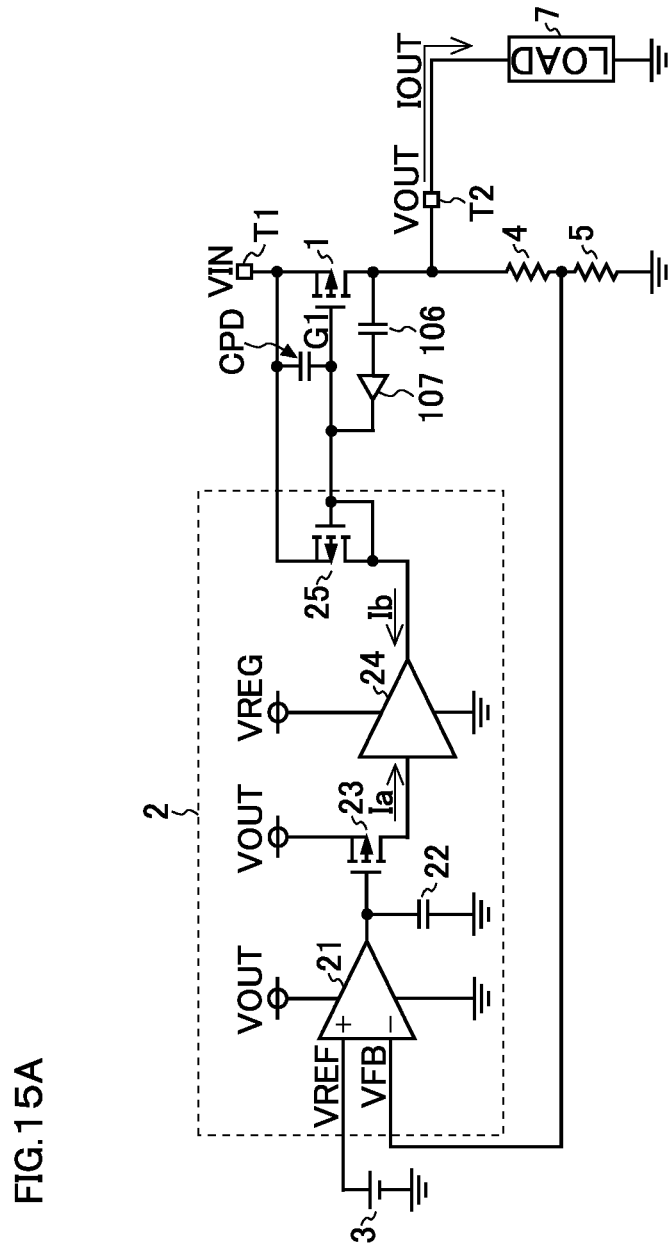
FIG. 15A is a diagram showing the configuration of a linear power supply circuit according to a seventh embodiment.

FIG. 15A is a diagram showing the configuration of a linear power supply circuit according to a seventh embodiment. In FIG. 15A, such parts as find their counterparts in FIG. 13 are identified by the same reference signs, and no detailed description will be repeated.

The linear power supply circuit shown in FIG. 15A differs from the linear power supply circuit shown in FIG. 13 in that it includes a buffer amplifier 107.

The input terminal of the buffer amplifier 107 is connected to the capacitor 106, and the output terminal of the buffer amplifier 107 is connected to the gate of the output transistor 1.

The buffer amplifier 107 passes a current that tends to pass from the drain toward the gate of the output transistor 1. Thus the linear power supply circuit according to this embodiment shown in FIG. 15A provides benefits similar to those of the linear power supply circuit according to the fifth embodiment shown in FIG. 13.

The buffer amplifier 107 stops a current that tends to pass from the gate toward the drain of the output transistor 1. Thus, with the linear power supply circuit according to this embodiment shown in FIG. 15A, when the input voltage VIN varies, it is possible to prevent the variation of the input voltage VIN from affecting the output voltage VOUT via the PMOSFET 25 and the capacitor 106.

Figure 15B:
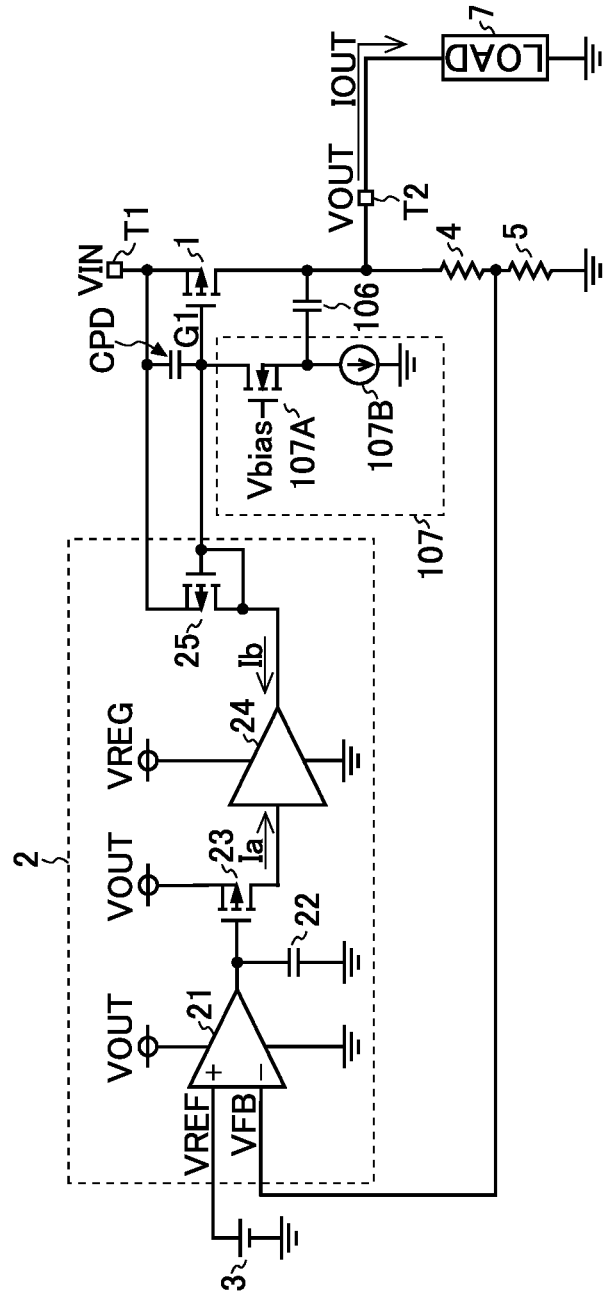
FIG. 15B is a diagram showing a specific example of the linear power supply circuit according to a seventh embodiment.

FIG. 15B is a diagram showing a specific example of the linear power supply circuit according to a seventh embodiment. In the linear power supply circuit shown in FIG. 15B, an NMOSFET 107A and a constant current source 107B constitute a buffer amplifier 107. The gate of the NMOSFET 107A is fed with a predetermined bias voltage Vbias. That is, the NMOSFET 107A is gate-grounded.

Even when, as the input voltage VIN varies, the drain voltage of the NMOSFET 107A varies, the drain current of the NMOSFET 107A does not vary. On the other hand, when, as the output voltage VOUT varies, the source voltage of the NMOSFET 107A varies, the gate-source voltage of the NMOSFET 107A varies, and thus the drain current of the NMOSFET 107A varies.

The buffer amplifier 107 is one example of a rectifier which is provided between the gate and the drain of the output transistor 1 and which serves to stop a current that tends to pass from the gate toward the drain of the output transistor 1 while passing a current that tends to pass from the drain toward the gate of the output transistor 1. Accordingly, instead of the buffer amplifier 107, any rectifier other than a buffer amplifier 107 can be used. It should however be noted that such a rectifier needs to have fast response such as not to impair the fast response of the linear power supply circuit.

9. Eighth Embodiment

Figure 16:
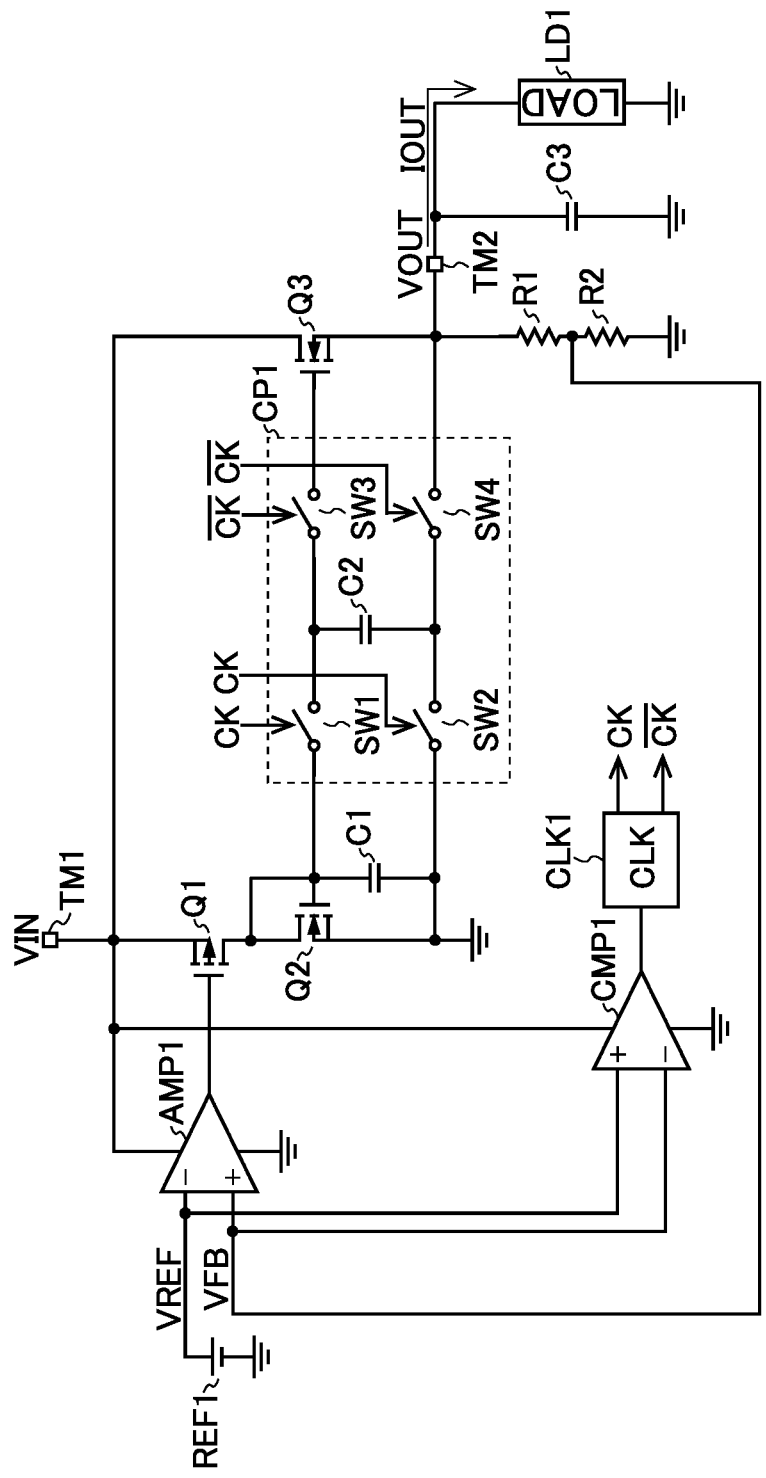
FIG. 16 is a diagram showing the configuration of a linear power supply circuit according to an eighth embodiment.

FIG. 16 is a diagram showing the configuration of a linear power supply circuit according to an eighth embodiment. The linear power supply circuit shown in FIG. 16 includes an input terminal TM1, an output terminal TM2, transistors Q1 to Q3, a charge pump circuit CP1, a reference voltage generator REF1, a differential amplifier AMP1, a capacitor C1, resistors R1 and R2, a comparator CMP1, and a clock signal generation circuit CLK1. The charge pump circuit CP1 includes switches SW1 to SW4 and a capacitor C2. The input terminal TM1, the output terminal TM2, the transistor Q3, and the charge pump circuit CP1 constitute a source follower circuit.

The linear power supply circuit shown in FIG. 16 has an output capacitor C3 and a load LD1 connected to it externally. Specifically the output capacitor C3 and the load LD1 are connected, in parallel with each other, externally to the output terminal TM2. The linear power supply circuit shown in FIG. 16 bucks (steps down) an input voltage VIN to generate an output voltage VOUT, and supplies the output voltage VOUT to the load LD7.

The transistor Q3 is provided between the input terminal TM1, to which the input voltage VIN is applied, and the output terminal TM2, to which the output voltage VOUT is applied. The transistor Q3 is an NMOSFET. Accordingly, the lower a gate signal G3 that is fed from the charge pump circuit CP1 to the gate of the reference voltage generator 3, the higher the conductance of the transistor Q1, and thus the higher the output voltage VOUT. Put reversely, the higher the gate signal G3, the lower the conductance of the transistor Q1, and thus the lower the output voltage VOUT.

The reference voltage generator REF1 generates a reference voltage VREF. The resistors R1 and R2 generate a feedback voltage VFB, which is a division voltage of the output voltage VOUT.

The inverting input terminal (−) of the differential amplifier AMP1 is fed with the reference voltage VREF, and the non-inverting input terminal (+) of the differential amplifier AMP1 is fed with the feedback voltage VFB. The differential amplifier AMP1 uses the input voltage VIN as its supply voltage. The differential amplifier AMP1 drives the transistor Q1 based on the difference ΔV (=VFB−VREF) between the reference voltage VREF and the feedback voltage VFB. That is, the output terminal of the differential amplifier AMP1 is connected to the gate of the transistor Q1.

The transistor Q1 is a PMOSFET. The source of the transistor Q1 is connected to the input terminal TM1. The drain of the transistor Q1 is connected to the drain and gate of the transistor Q2, which is an NMOSFET, to one terminal of the capacitor C1, and to one terminal of the switch SW1. The source of the transistor Q2 is connected to the ground potential, to the other terminal of the capacitor C1, and to one terminal of the switches SW2.

The other terminal of the switch SW1 is connected to one terminal of the capacitor C2 and to one terminal of the switches SW3. The other terminal of the switches SW3 serves as the output terminal of the charge pump circuit CP1. The other terminal of the switches SW2 is connected to the other terminal of the capacitor C2 and to one terminal of the switches SW4. The other terminal of the switches SW4 is connected to the output terminal TM2.

The switches SW1 and SW2 in the charge pump circuit CP1 are turned on and off by the clock signal CK. The switches SW3 and SW4 are turned on and off by the inverted clock signal bar-CK. As a result of the charge pump circuit CP1 operating based on the clock signal CK and the inverted clock signal bar-CK, the gate of the transistor Q3 is fed with a voltage which is the sum of the source voltage of the transistor Q3, which is an NMOSFET, and the charge voltage of the capacitor C2 (i.e., a voltage having the same value as the charge voltage of the capacitor C1).

As described above, the charge pump circuit CP1 drives the transistor Q3. Thus the source follower circuit constituted by the input terminal TM1, the output terminal TM2, the transistor Q3, and the charge pump circuit CP1 permits the gate voltage of the transistor Q3, which is an NMOSFET, to be higher than the input voltage VIN. Thus the above source follower circuit can reduce the drop in the source voltage of the transistor Q3 (i.e., the difference between the input voltage VIN and the source voltage of the transistor Q3) when the input voltage VIN falls. Owing to the provision of the above source follower circuit, the linear power supply circuit shown in FIG. 16 can reduce the drop in the output voltage VOUT (the difference between the input voltage VIN and the output voltage VOUT) when the input voltage VIN falls.

Next, the comparator CMP1 and the clock signal generation circuit CLK1 will be described. The non-inverting input terminal (+) of the comparator CMP1 is fed with the reference voltage VREF, and the inverting input terminal (−) of the comparator CMP1 is fed with the feedback voltage VFB. The comparator CMP1 uses the input voltage VIN as its supply voltage. The comparator CMP1 compares the reference voltage VREF with the feedback voltage VFB to output, when the feedback voltage VFB is lower than the reference voltage VREF, a high-level output signal and, when the feedback voltage VFB is higher than the reference voltage VREF, a low-level output signal.

Here, a case where the feedback voltage VFB is lower than the reference voltage VREF is equivalent to a case where the output voltage VOUT is lower than a predetermined value (the value resulting from multiplying the reference voltage VREF by the reciprocal of the division ratio of resistors R1 and R2). When the feedback voltage VFB and the reference voltage VREF are equal, the output signal of the comparator CMP1 may be at whichever of high level and low level.

The output signal of the comparator CMP1 is fed, as an enable signal, to the clock signal generation circuit CLK1.

When the output signal of the comparator CMP1 is at high level, the clock signal generation circuit CLK1 is in an enabled state, and outputs the clock signal CK and the inverted clock signal bar-CK. The clock signal CK and the inverted clock signal bar-CK are fed to the charge pump circuit CP1. This enables the charge pump circuit CP1 to operate.

On the other hand, when the output signal of the comparator CMP1 is at low level, the clock signal generation circuit CLK1 is in a disabled state, and do not output the clock signal CK and the inverted clock signal bar-CK. Thus, the charge pump circuit CP1 too do not operate. That is, it is possible, when the feedback voltage VFB is higher than the reference voltage VREF, to keep the clock signal generation circuit CLK1 and the charge pump circuit CP1 out of operation. It is thus possible to suppress the power consumption by the clock signal generation circuit CLK1 and the charge pump circuit CP1 in a no-load condition (i.e., when the impedance of the load LD1 can be regarded as infinitely high).

10. Ninth Embodiment

Figure 17:
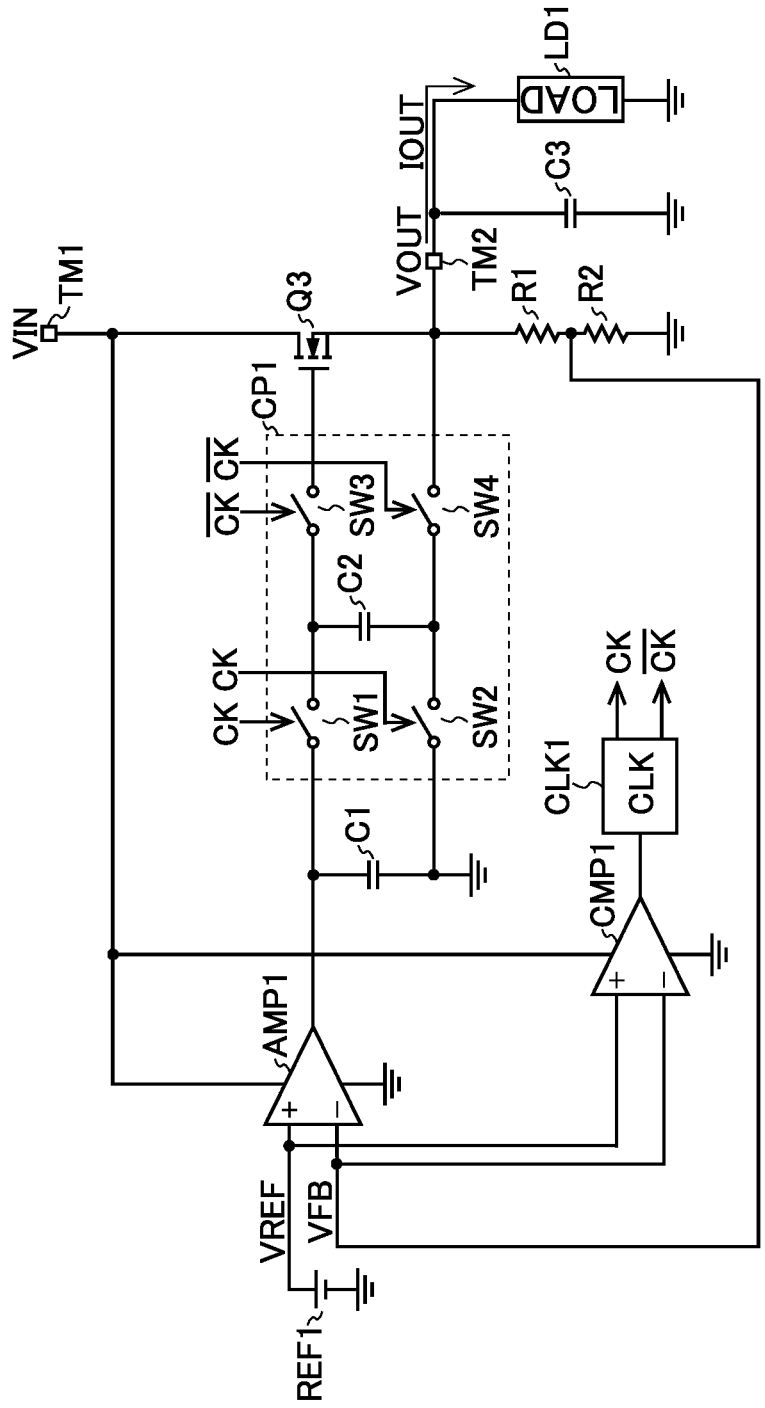
FIG. 17 is a diagram showing the configuration of a linear power supply circuit according to a ninth embodiment.

FIG. 17 is a diagram showing the configuration of a linear power supply circuit according to a ninth embodiment. The linear power supply circuit shown in FIG. 17 differs from the linear power supply circuit shown in FIG. 16 in that the transistors Q1 and Q2 are omitted, that the reference voltage VREF is fed to the non-inverting input terminal (+) of the differential amplifier AMP1, and that the feedback voltage VFB is fed to the inverting input terminal (−) of the differential amplifier AMP1, and is otherwise the same as the linear power supply circuit shown in FIG. 16.

The linear power supply circuit shown in FIG. 17 provides benefits similar to those of the linear power supply circuit shown in FIG. 16.

11. Applications

Figure 18:
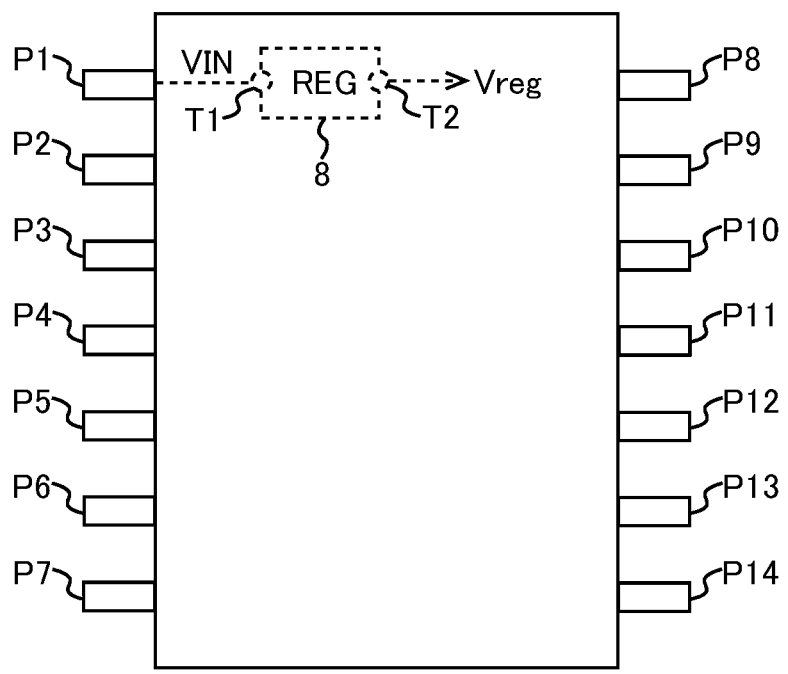
FIG. 18 is an exterior view of a semiconductor integrated circuit device.

FIG. 18 is an exterior view of a semiconductor integrated circuit device. The semiconductor integrated circuit device shown in FIG. 18 has external pins P1 to P14 and incorporates an internal power supply 8. The internal power supply 8 can be a linear power supply circuit according to any of the first to fourth embodiments described previously. The internal power supply 8 supplies an internal supply voltage Vreg (i.e., the output voltage VOUT of the linear power supply circuit) to at least some of the circuits within the semiconductor integrated circuit device shown in FIG. 18.

The input terminal T1 of the internal power supply 8 is connected to the external pin P1. In a modified version of the example under discussion, the input terminal T1 of the internal power supply 8 may be connected to a plurality of external pins.

On the other hand, the output terminal T2 of the internal power supply 8 is not connected to any of the external pins P1 to P14. The linear power supply circuit used as the internal power supply 8 is a power supply circuit that does not require an externally connected capacitor, and thus there is no need to connect the output terminal T2 of the internal power supply 8 to an external pin. This eliminates the need to provide a protection circuit for the output section of the internal power supply 8. Thus using the linear power supply circuit according to any of the first to seventh embodiments described previously as the internal power supply 8 greatly contributes to size reduction and cost reduction in semiconductor integrated circuit devices.

Figure 19:
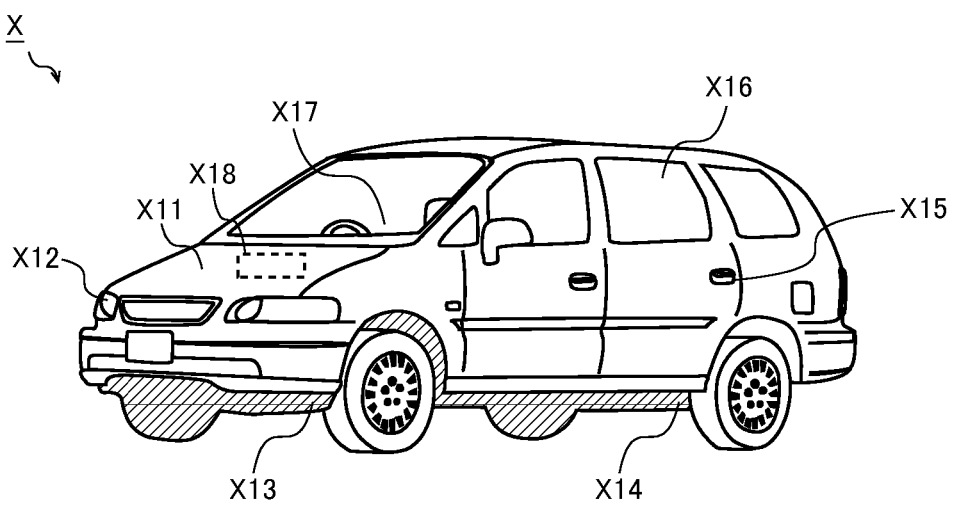
FIG. 19 is an exterior view of a vehicle.

FIG. 19 is an exterior view of a vehicle X. The vehicle X of this configuration example incorporates various electronic appliances X11 to X18 that operate by being fed with a voltage supplied from a battery (not shown). For the sake of convenience, FIG. 19 may not show the electronic appliances X11 to X18 at the places where they are actually arranged.

The electronic appliance X11 is an engine control unit which performs control with respect to an engine (injection control, electronic throttle control, idling control, oxygen sensor heater control, automatic cruise control, etc.).

The electronic appliance X12 is a lamp control unit which controls the lighting and extinguishing of HIDs (high-intensity discharged lamps) and DRLs (daytime running lamps).

The electronic appliance X13 is a transmission control unit which performs control with respect to a transmission.

The electronic appliance X14 is a behavior control unit which performs control with respect to the movement of the vehicle X (ABS [anti-lock brake system] control, EPS (electric power steering) control, electronic suspension control, etc.).

The electronic appliance X15 is a security control unit which drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as A/V (audio/visual) equipment, a car navigation system, and an ETC (electronic toll control system).

The electronic appliance X18 comprises electronic appliances provided with high-withstand-voltage motors, such as a vehicle-mounted blower, an oil pump, a water pump, and a battery cooling fan.

Any of the linear power supply circuits and semiconductor integrated circuit devices described previously can be built in any of the electronic appliances X11 to X18.

12. Others

The embodiments disclosed herein should be considered to be in every aspect illustrative and not restrictive, and the technical scope of the present invention is defined not by the description of embodiments given above but by the scope of the appended claims and should be understood to encompass any modifications within a spirit and scope equivalent to the claims.

For example, while the first to seventh embodiments described above deal with configurations where the linear power supply circuit does not include an output capacitor, the linear power supply circuit may include (incorporate) an output capacitor (the capacitor connected to the output terminal T2) with a capacitance less than 100 nF.

REFERENCE SIGNS LIST 1 output transistor
2 driver
8 internal power supply
21, 21' differential amplifier
22, 22' capacitor
23 PMOSFET (one example of a converter)
23' NMOSFET (another example of a converter)
24 current amplifier
101, 102 NMOSFET
103, 106 capacitor
104, CP1 charge pump circuit
105, CLK1 clock signal generation circuit
T1, TM1 input terminal
T2, TM2 output terminal
P1 to P14 external pin
Q1 transistor
X vehicle

The invention claimed is:

1. A linear power supply circuit, comprising:
an output transistor provided between an input terminal to which an input voltage is applied and an output terminal to which an output voltage is applied; and
a driver configured to drive the output transistor based on a difference between a voltage based on the output voltage and a reference voltage,
wherein
the driver includes:
a differential amplifier configured to output a voltage commensurate with the difference between the voltage based on the output voltage and the reference voltage;
a first capacitor of which one terminal is fed with an output of the differential amplifier and of which another terminal is fed with a ground potential;
a converter configured to convert a voltage based on the output of the differential amplifier into a current and output the current; and
a current amplifier configured to current-amplify an output of the converter,
a supply voltage for the differential amplifier and for the converter is a voltage that depends on the output voltage, and
the linear power supply circuit further includes:
a source follower circuit or emitter follower circuit including a first transistor of which a first terminal is connected to the input terminal and of which a second terminal is connected to the output terminal;
a second transistor connected in series with the output transistor, the second transistor together with the first transistor constituting a current mirror circuit; and
a second capacitor connected to the current amplifier or to a control terminal of the first transistor.

2. The linear power supply circuit according to claim 1, wherein the second capacitor is connected to the control terminal of the first transistor.

3. The linear power supply circuit according to claim 2, wherein
the linear power supply circuit includes the source follower circuit,
the linear power supply circuit further includes a charge pump circuit provided between the first and second transistors,
the charge pump circuit includes the second capacitor, the charge pump circuit being configured to charge the second capacitor with a voltage higher than the input voltage and to feed a charge voltage of the second capacitor to the control terminal of the first transistor.

4. The linear power supply circuit according to claim 3, wherein the charge pump circuit is configured to operate based on a clock signal with a clock frequency depending on a source current passing from the output terminal toward a load.

5. The linear power supply circuit according to claim 3, wherein the charge pump circuit is configured to operate based on a clock signal with a clock frequency depending on a scalar sum of a source current passing from the output terminal toward a load and a sink current passing from the load toward the output terminal.

6. The linear power supply circuit according to claim 3, wherein the linear power supply circuit is configured to be switchable between
- a first mode in which the charge pump circuit operates and
- a second mode in which the charge pump circuit does not operate and in which the control terminal of the first transistor and a control terminal of the second transistor are at equal potentials.

7. The linear power supply circuit according to claim 1, wherein no capacitor is connected to the output terminal.

8. The linear power supply circuit according to claim 1, wherein a capacitor with a capacitance less than 100 nF is connected to the output terminal.

9. A semiconductor integrated circuit device, comprising:
a plurality of external pins; and
the linear power supply circuit according to claim 1 as an internal power supply,
wherein the input terminal is connected to one or more of the plurality of the external pins and the output terminal is connected to none of the plurality of external pins.

10. A vehicle, comprising:
the linear power supply circuit according to claim 1.

* * * * *